United States Patent [19]
Fujimoto

[11] Patent Number: 4,466,126
[45] Date of Patent: Aug. 14, 1984

[54] TUNER APPARATUS
[75] Inventor: Isao Fujimoto, Katano, Japan
[73] Assignee: Sanyo Electric Co., Ltd., Osaka, Japan
[21] Appl. No.: 154,234
[22] Filed: May 29, 1980
[30] Foreign Application Priority Data Jun. 4, 1979 [JP] Japan .................................. 54-70430
Jun. 29, 1979 [JP] Japan .................................. 54-83331
Jul. 14, 1979 [JP] Japan ............................. 54-96893[U]

[51] Int. Cl.³ ............................ H03J 7/08; H04B 1/16
[52] U.S. Cl. .................................... 455/169; 455/195; 455/217
[58] Field of Search ............... 455/179, 169, 165, 166, 455/183, 186, 195, 197, 217, 343, 347; 334/11, 85; 358/191.1, 193.1, 195.1

[56] References Cited
U.S. PATENT DOCUMENTS

| 3,559,076 | 1/1971 | Worcester | 455/169 |
|---|---|---|---|
| 3,639,840 | 2/1972 | Shekel | 455/132 |
| 3,828,257 | 8/1974 | Puskas | 455/180 |
| 3,965,427 | 6/1976 | Ma | 455/180 |
| 3,968,440 | 7/1976 | Ehni | 455/180 |
| 4,081,752 | 3/1978 | Sumi | 455/165 |
| 4,110,693 | 8/1978 | Evans | 455/180 |
| 4,137,502 | 1/1979 | Maddaloni | 455/343 |
| 4,189,678 | 2/1980 | Sakamoto | 455/180 |

FOREIGN PATENT DOCUMENTS 2362437 5/1978 Fed. Rep. of Germany .
948363 1/1964 United Kingdom ................ 455/343

OTHER PUBLICATIONS
A System Approach to Low–Cost Electronic Tuning Address, by Howell, IEEE Transactions on Consumer Electronics, vol. CE-24, No. 3, 8/78, pp. 408-416.

Primary Examiner—Tommy P. Chin
Attorney, Agent, or Firm—Armstrong, Nikaido, Marmelstein & Kubovcik

[57] ABSTRACT

A television tuner comprises a tuning circuit including a voltage controlled variable capacitance diode. The tuning circuit is housed within a shield casing. The shield casing is provided with a terminal for electrical connection to the variable capacitance diode and the terminal is supplied with a tuning voltage from a channel selecting apparatus. A Zener diode is connected between the tuning voltage terminal and the shield casing, whereby the upper limit of the tuning voltage being applied to the variable capacitance diode is restricted. A predetermined voltage determinable dependent on the Zener diode is selected such that the tuning frequency established by the tuning circuit when the predetermined voltage is applied to the variable capacitance diode may be a predetermined upper limit frequency of a desired receiving frequency band. The lower limit of the tuning voltage is also restricted so as not to become lower than a predetermined voltage. Accordingly, the tuning frequency is prevented from being changed toward a higher or lower frequency deviating from the corresponding variation range of the desired receiving frequency band.

41 Claims, 19 Drawing Figures

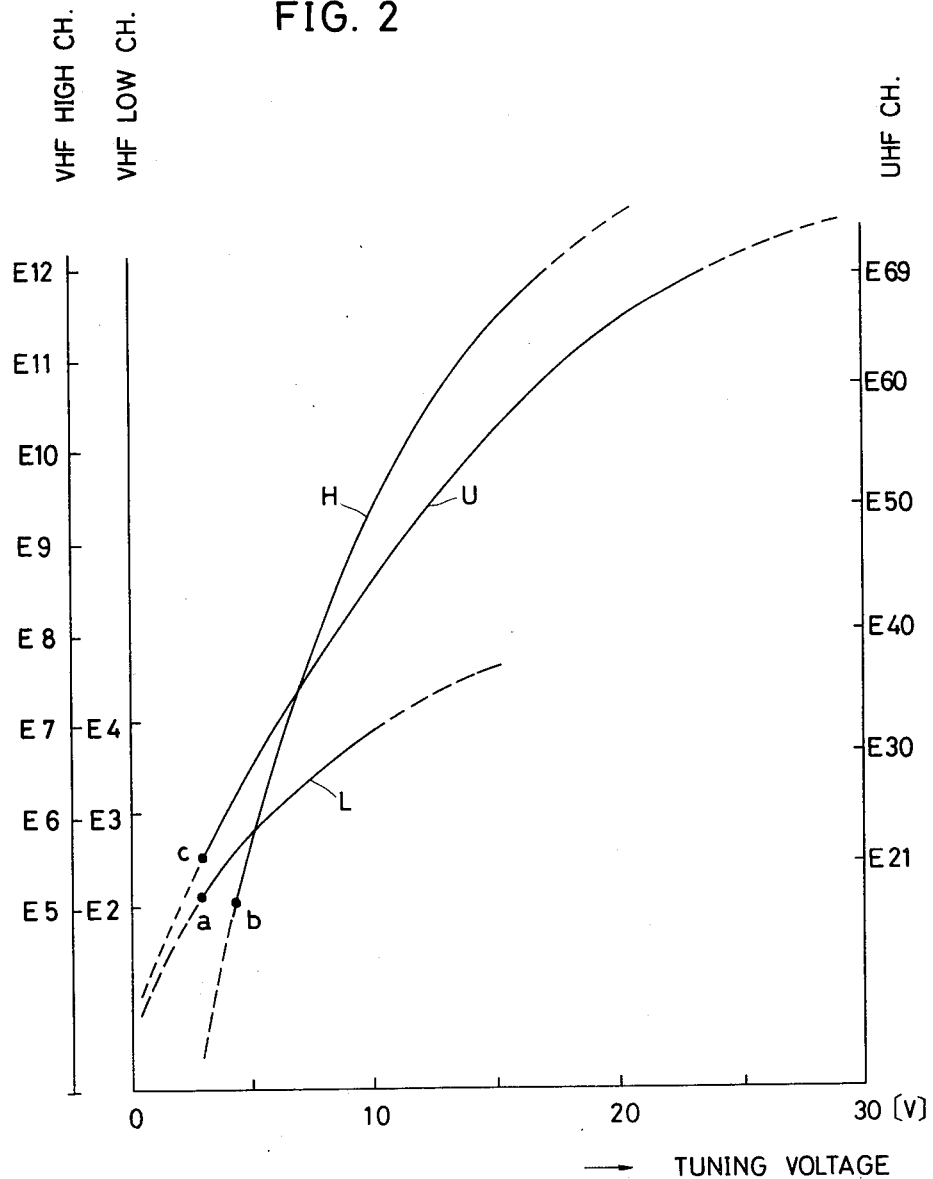
FIG. 2
FIG. 3
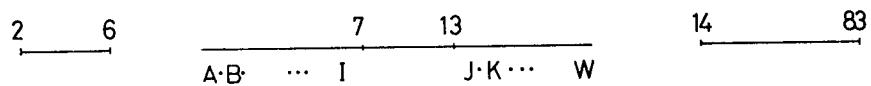

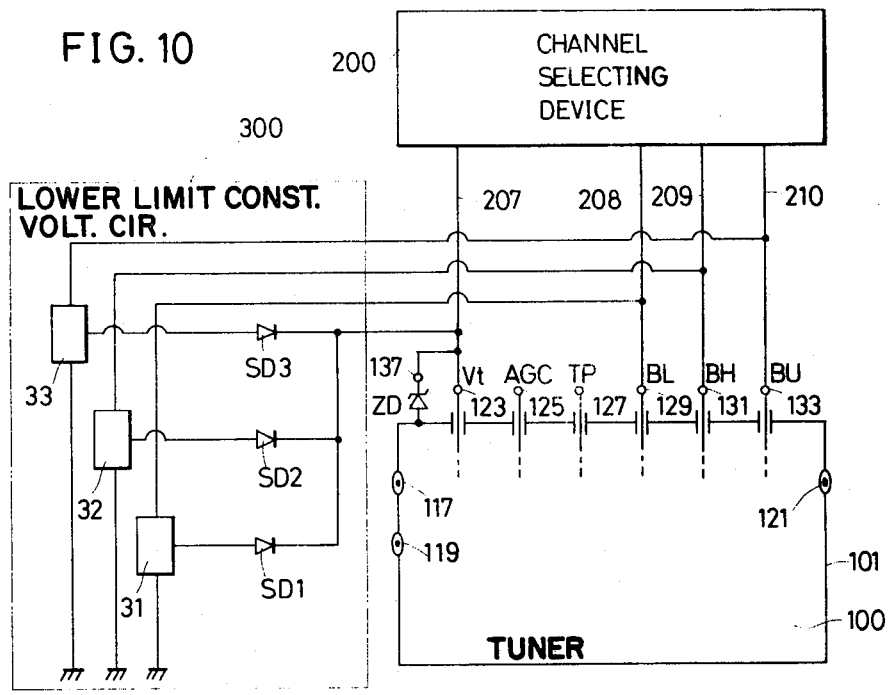
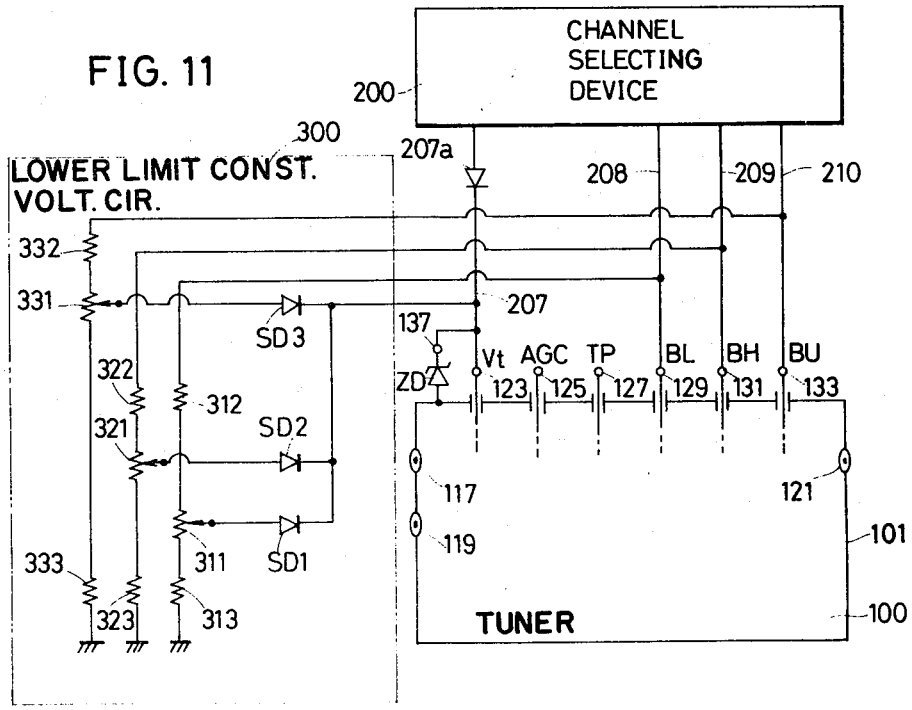

TUNER APPARATUS

BACKGROUND OF THE INVENTION

1. Field of the Invention;

The present invention relates to a tuner apparatus. More specifically, the present invention relates to a turner apparatus employing a voltage controlled variable reactance device such as a voltage conrolled variable capacitance diode for use in a television receiver, an FM receiver and the like.

2. Description of the Prior Art;

FIG. 1 is a block diagram showing one example of a tuner apparatus of a television receiver of the superheterodyne system wherein the present invention can be advantageously employed. Since such television tuner is well-known to those skilled in the art, only those portions associated with the present invention will be briefly described. A tuner 100 comprises two input terminals 117 and 119. The input terminal 117 is connected to receive a television signal received by a VHF antenna 1. The input terminal 119 is connected to receive a television signal received by a UHF antenna 2. The received signal from the VHF antenna input terminal 117 is applied to a VHF high frequency amplifier 103 and is amplified and the amplified output therefrom is applied to a VHF mixer 105. The tuner 100 also comprises a VHF local oscillator 107. The oscillation output of the VHF local oscillator 107 is applied to a VHF mixer 105. Accordingly, the VHF mixer 105 serves to mix the VHF television signal with the oscillation output from the VHF local oscillator 107, thereby to convert the VHF television signal into a VHF intermediate frequency signal. On the other hand, the received signal applied to the UHF antenna input terminal 119 is applied to a UHF high frequency amplifier 109 and is amplified and the amplified output therefrom is applied to a UHF mixer 111. The tuner 100 also comprises a UHF local oscillator 113 and the osciallation output therefrom is applied to a UHF mixer 111. Accordingly, the UHF mixer 111 serves to mix the UHF television signal with the oscillation output from the UHF local oscillator 113, thereby to convert the UHF television signal into a UHF intermediate frequency signal. The output from the UHF mixer 111, i.e. the UHF intermediate frequency signal is amplified by a UHF intermediate frequency amplifier 115 and is applied to a VHF mixer 105. On the occasion of reception of the UHF signal, the VHF high frequency amplifier 103 and the VHF local oscillator 107 are disabled, while the VHF mixer 105 is kept enabled. Accordingly, on the occasion of reception of the UHF signal, the VHF mixer 105 serves as a UHF intermediate frequency amplifier for amplifying the UFH intermediate frequency signal. Meanwhile, on the occasion of reception of the VHF signal, those circuits 109, 111, 113 and 115 associated with the UHF signal are all disabled, while only those circuits 103, 105, and 107 associated with the VHF signal are enabled. The VHF intermediate frequency signal or the UHF intermediate frequency signal obtained from the VHF mixer 105 is applied from the output terminal 121 to the subsequent stage intermediate frequency circuit, not shown. These circuits 103 to 115 are housed within a shield member 101 of such as a metallic casing or frame. Therefore, any undesired radiation from those circuits housed within the shield member 101 toward other wireless equipment is effectively prevented, while any undesired electric wave or interference electric wave from other wireless equipment to those circuits is also effectively prevented. The above described antenna input terminals 117 and 119 and the intermediate frequency output terminal 121 are formed at predetermined positions of the shield member 101, while these terminals are electrically isolated from the shield member 101.

The VHF high frequency amplifier 103, the VHF local oscillator 107, the UHF high frequency amplifier 109 and the UHF local oscillator 113 each comprise a tuning circuit, not shown, for varying the tuning frequency for selection of a desired channel within a desired receiving frequency band. Each of these tuning circuits comprises a voltage controlled variable reactance device such as a voltage controlled variable capacitance diode. To that end, the tuner 100 housed in the shield member 101 is also provided with a tuning voltage input terminal 123, as electrically isolated from the shield member 101, for supply of the tuning voltage Vt. The tuning voltage Vt from the terminal 123 is applied to the associated circuits 103, 107, 109, and 113. The shield member 101, i.e. the tuner 100, further comprises a test point (TP) terminal 127, as electrically isolated from the shield member 101, for supply of the output from the tuner 100 to alignment equipment, not shown, for alignment of the output waveform on the occasion of adjustment of the tuner 100. In general, the VHF band comprises a VHF low band (the first band) of a relatively low frequency range and a VHF high band (the second band) of a relatively high frequency range. On the other hand, the UHF band may be considered as the third band of a frequency range higher than that of the VHF high band. Accordingly, the tuner 100 further comprises terminals 129, 131, and 133, as electrically isolated from the shield member 101, for supply of voltage signals for selection of these frequency bands. More specifically, the terminal 129 is aimed to supply a band selection voltage BL for selection of the VHF low band, the terminal 131 is aimed to provide a band selection voltage BH for selection of the VHF high band, and the terminal 133 is aimed to provide a band selection voltage BU for selection of the UHF band. The tuner 100 further comprises a terminal 125 for supply of an automatic gain control (AGC) voltage obtained from the intermediate frequency circuit, not shown, and a terminal 135 for supply of an automatic fine tuning (AFT) voltage, both electrically isolated from the shield member 101. Each of the terminals 129, 131, and 133 is supplied with the band selection voltage BL, BH or BU of +15 V, when the corresponding receiving frequency band is to be selected. Each of the tuning circuits included in the tuner 100 is structured to be responsive to the given band selection voltage BL, BH or BU to change the circuit constant or circuit connection of the tuning scheme so as to be adaptable to the corresponding frequency band, as well-known to those skilled in the art.

As described in the foregoing, the tuner 100 employs a voltage controlled variable capacitance diode as a tuning element of each of the tuning circuits. In such conventional tuner, the tuning voltage Vt being supplied to the variable capacitance diode was determined in accordance with a given condition. In the following, therefore, such determination of the tuning voltage will be described with reference to an example of a television tuner in West Germany, as shown in FIG. 2. Referring to FIG. 2, the abscissa indicates the tuning voltage and the ordinate indicates the respective channels in the VHF low band, the VHF high band and the UHF band. In West Germany, for example, the VHF low band (the first band) covers channels E2 to E4, while the VHF high band (the second band) covers channels E5 to E12. The UHF band (the third band) covers channels E21 to E69. Such tuner has been designed such that the lower limit frequency of the VHF low band may be determined so that channel E2 can be received when the tuning voltage Vt is 3 V, for example. However, a television tuner must be capable of surely selecting channel E2 even in any situation and even in the worst condition. More specifically, in consideration of a frequency drift due to a source voltage fluctuation, an ambient temperature variation, a time dependent change and so on, a frequency deviation due to a mechanical shock, and the like, the television tuner must be designed to be capable of surely receiving channel E2 even in the worst condition which seldom occurs. Therefore, accordingly to a conventional approach, the tuner was designed such that the tuning voltage Vt which is as low as 0.2 to 0.3 V, for example, and is sufficiently lower than the above described 3 V, may be supplied from the channel selecting apparatus, not shown. As a result, with such a conventional television tuner, the receivable frequency range extended over the lower region beyond the necessary receivable frequency range shown by the dotted line in FIG. 2 in a normal use condition. For example, a conventional tuner was adapted such that in the case of the VHF low band shown by the curve L in FIG. 2 the signal can be received even when the frequency becomes lower than that of channel E2 by a frequency difference corresponding to approximately one channel. A conventional tuner was further adapted such that in the case of the VHF high band shown by the curve H the signal can be received even when the frequency becomes lower than the lower limit channel E5 by a frequency difference corresponding to approximately three channels. A conventional tuner was further adapted such that in the case of the UHF band shown by the curve U the signal can be received even when the frequency becomes lower than the lower limit channel E21 by a frequency difference corresponding to approximately ten channels. A conventional television tuner was further adapted such that as for the upper limit of the respective bands as well the signal of any desired receiving frequency band can be surely received with a sufficient margin in full consideration of any imaginable worst condition.

However, for the purpose of effective utilization of the electric wave and observance of secrecy of communication, in some countries there have been tendencies to restriction of reception by a tuner beyond the receivable frequency range in a television receiver, for example. More specifically, some countries have shown tendencies to legislation to restrict the receivable frequency range by a tuner in a television receiver at the upper and lower limits of the respective receiving frequency bands as shown in FIG. 2, with a margin frequency corresponding to one channel, respectively.

For example, in West Germany, the FTZ (Fermnelde Technisches Zentralamt) has made the following proposal in the draft of January, 1979. More specifically, in West Germany the frequency range for the television broadcasting has been determined such that the Band I covers 47 MHz to 68 MHz, the Band III covers 174 MHz to 230 MHz and the Bands IV and V cover 470 MHz to 790 MHz. A deviation allowance outside the frequency range at each of the upper and lower limits of the frequency range of each band has been determined in principle as 300 kHz. By way of an exception, as for the receiving frequency band of 47 MHz to 870 MHz, a deviation allowance outside the frequency range has been determined as 7 MHz at the lower limit of the frequency range and as 8 MHz at the upper limit of the frequency range.

An attempt has also been made to make similar restriction in the case of the Canadian television broadcasting shown in FIG. 3. According to the Canadian television broadcasting standard, the VHF low band comprises Channel Nos. 2 to 6, the VHF high band comprises Channel Nos. 7 to 13, and the UHF band comprises Channel Nos. 14 to 84. According to the draft of October, 1978 by the Canadian DOC (Department of Communications) and the further developments thereof, the following restriction has been planed. More specifically, according to the Canadian television broadcasting standard, the channels for the CATV have been allotted in the region lower than Channel No. 7 and in the region higher than Channel No. 13. Therefore, a restriction has been planned in Canadian television receivers such that some of the CATV channels allotted in the region lower than Channel No. 7 and in the region higher than Channel No. 13 are made absolutely unreceivable. More specifically, television receivers originally not designed to receive such CATV broadcasting are sufficient enough to be capable of surely receiving only the television signal of Channel Nos. 2 to 6, Nos. 7 to 13, and Nos. 14 to 83 and therefore a restriction has been planned to make such receivers incapable of receiving a signal in Channels A to I of the CATV channels in the region lower than Channel No. 7 and a signal in CATV Channels A to W in the region higher than Channel No. 13. In making such restriction, however, one channel, i.e. Channel I in the region immediately lower than Channel No. 7 and one channel, i.e. Channel J in the region immediately higher than Channel No. 13 have been considered as allowable for a deviation range.

As described in the foregoing, in some countries there have been tendencies to a strict restriction to a deviation downward or upward from the origianl receiving frequency band, for the purpose of effective utilization of an electric wave and observavance of communication secrecy.

SUMMARY OF THE INVENTION

Briefly described, for the purpose of preventing the upper limit of the tuning frequency in a given receiving frequency band from deviating to the region higher than a predetermined frequency range which has been already restricted or will be restricted, the present invention comprises means for restricting to the value lower than a given voltage a variation of a tuning voltage being applied to a voltage controlled variable reactance device in a tuning circuit of a tuner apparatus. As a result, a tunable frequency by such tuning circuit can be prevented from changing to deviate from a given receiving frequency band even in any change of a reception state and the circumstances.

In a preferred embodiment of the present invention, a constant voltage diode such as a Zener diode is employed to restrict to a predetermined value the upper limit of the tuning voltage being applied to a voltage controlled variable reactance device. Accordingly, such restriction of the tuning voltage can be attained with a circuit of a simple structure.

More preferably, the above described Zener diode is provided in a tuner, whereby the above described tuning voltage is restricted to a predetermined value in the tuner. By thus providing a Zener diode in the tuner, the tuner circuit configuration can be commonly utilized to any type of channel selecting apparatuses, without changing the structure of the tuner per se, even when the tuning voltage from a channel selecting apparatus is different depending on the models of the channel selecting apparatuses or the type or structure of the channel selecting apparatuses is different. As a result, a tuner apparatus suited for mass production is provided.

In another preferred embodiment of the present invention, a tuning circuit is housed within a shield member. The shield member is provided with a terminal for electrical connection to a voltage controlled variable reactance device and for electrical isolation from the shield member. The terminal is connected to receive the tuning voltage from a channel selection apparatus. A constant voltage diode such as a Zener diode is connected between the shield member and the tuning voltage terminal, whereby the voltage being applied to the voltage controlled variable reactance device is restricted. According the present preferred embodiment of the present invention, the present inventive implementation can be simply achieved without any substantial change to a conventional tuner apparatus.

In a further preferred embodiment of the present invention, the lower limit of the tuning voltage being applied to a voltage controlled variable reactance device is also restricted. Accordingly, the tuning frequency is also prevented from deviating toward the region lower than the lower limit of the receiving frequency band.

As means for restricting the lower limit of the tuning voltage to a predetermined voltage, a scheme is employed wherein such predetermined voltage is applied to the voltage controlled variable reactance device when the tuning voltage obtained from the channel selecting apparatus is lower than the above described predetermined voltage and the tuning voltage is applied to the voltage controlled variable reactance device when the tuning voltage is larger than the above described predetermined voltage. According to the preferred embodiment, such restriction of the lower limit of the tuning voltage can be achieved with relative simplicity and certainty.

Accordingly, a principal object of the present invention is to provide an improved tuner apparatus, wherein a deviation of the tuning frequency being presently restricted or being restricted in the future is surely adapted to the restriction range.

Another object of the present invention is to provide a tuner apparatus, wherein a deviation of the tuning frequency, if occurs, is restricted to a slight region exceeding the upper limit frequency of a desired receiving frequency band.

A further object of the present invention is to provide a tuner apparatus, wherein a deviation of a tuning frequency, if occurs, is restricted to a slight region lower than the lower limit frequency of a desired receiving frequency band.

Still another object of the present invention is provide a tuner apparatus wherein a restriction can be made to a tuning frequency with a simple structure.

Still a further object of the present invention is to provide a tuner apparatus which is adaptable to any type of channel selecting apparatuses and adapted for restricting the tuning frequency to a predetermined frequency range.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph showing a relation betwen the tuning voltage and the frequency (the receiving channels) of a television system proposed in West Germany for explaining the background of the present invention;

FIG. 3 is a graph showing the distribution of channels of the television broadcasing standard in Canada;

FIGS. 5A and 5B are schematic diagrams of a television tuner taken as an example of the present invention, wherein FIG. 5A shows a UHF portion and FIG. 5B shows a VHF portion;

FIGS. 10 and 11 are outline views for depicting other embodiments of the present invention;

DESCRIPTION OF THE PREFERRED EMBODIMENTS

In the following description the present invention will be described by taking several examples wherein the present invention is embodied in a television tuner; however, it is pointed out that the present invention can be applied not only to a television tuner but also to an FM receiver and the like.

Figure 4:
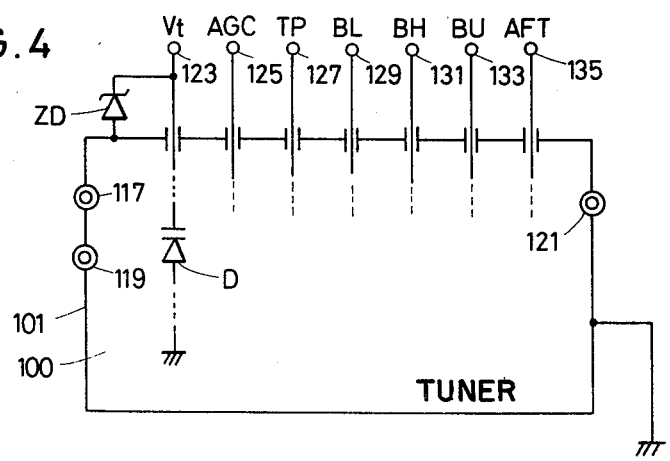
FIG. 4 is an outline view showing the principle of the present invention.

FIG. 4 is an outline view for depicting the principle of the present invention. Referring to FIG. 4, a variable capacitance diode D serving as a voltage controlled variable reactance device is provided within a shield member 101 of a tuner 100. Although only one variable capacitance diode D is shown representing others in FIG. 4, in actuality a plurality of such variable capacitance diodes are provided in the tuner 100. The tuner 100 is also provided with a terminal 123, as electrically isolated from the shield member 101, for supply of a tuning voltage Vt. A Zener diode ZD serving as an upper limit constant voltage forcing means and constituting a feature of the present invention is connected between the terminal 123 and the shield case 101. The Zener diode ZD serves to restrict or limit the voltage being applied to the voltage controlled variable capacitance diode D to prevent the same from exceeding a predetermined value.

More specifically, if and when the tuning voltage Vt from a channel selecting apparatus, not shown, is about to exceed a predetermined value determinable by the Zener diode ZD, the Zener diode ZD functions to be rendered conductive, whereby the voltage controlled variable capacitance diode D is prevented from being supplied with a voltage exceeding the predetermined voltage restricted by the Zener diode ZD. The above described predetermined voltage determined by the Zener diode ZD is selected such that when the same is applied to the voltage controlled variable capacitance diode D the tuning frequencies by the respective tuning circuits fall within a predetermined frequency range associated with the upper limit of a desired receiving frequency band. For example, in the case of the television broadcasting standard proposed in West Germany, the receivable highest frequency of the UHF band is adapted to be restricted by the Zener diode ZD and in the case of the television broadcasting standard planned in Canada the receivable highest frequency of the VHF high band is adapted to be restricted by the Zener diode ZD. Since the Zener diode ZD serves to restrict the voltage on the part of the tuner 100, a deviation of the frequency from the previously described regulations such as the FTZ standard, the DOC standard and the like can be avoided, even when the tuning voltage Vt from a channel selecting apparatus largely fluctuates due to a fluctuation of the source voltage, an ambient temperature variation, and the like, or even in the worst condition. Meanwhile, in the FIG. 4 diagram, the terminals, 125, 127, 129, 131, 133 and 135 are the same as those corresponding ones shown in the FIG. 1 diagram.

Still referring to FIG. 4, although the Zener diode ZD was depicted as provided outside the shield member 101 of the tuner 100, alternatively the Zener diode ZD may be housed within the shield member 101. In such a situation, preferably the Zener diode is shield by another means for the purpose of preventing a high frequency noise that could be generated from the Zener diode.

Figure 5A:
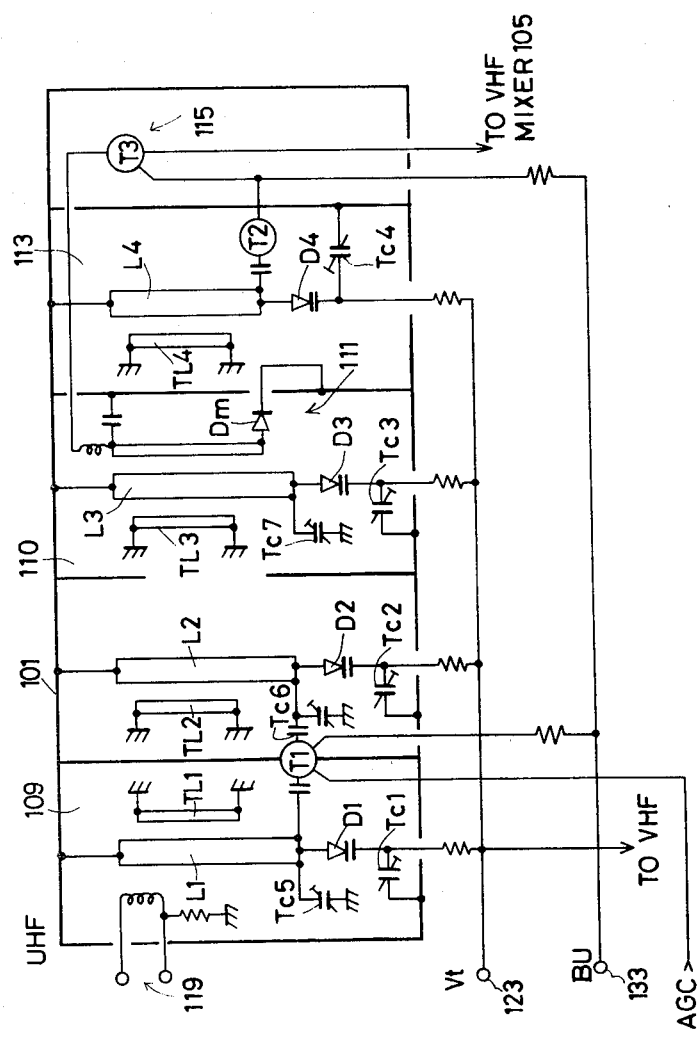
Figure 5B:
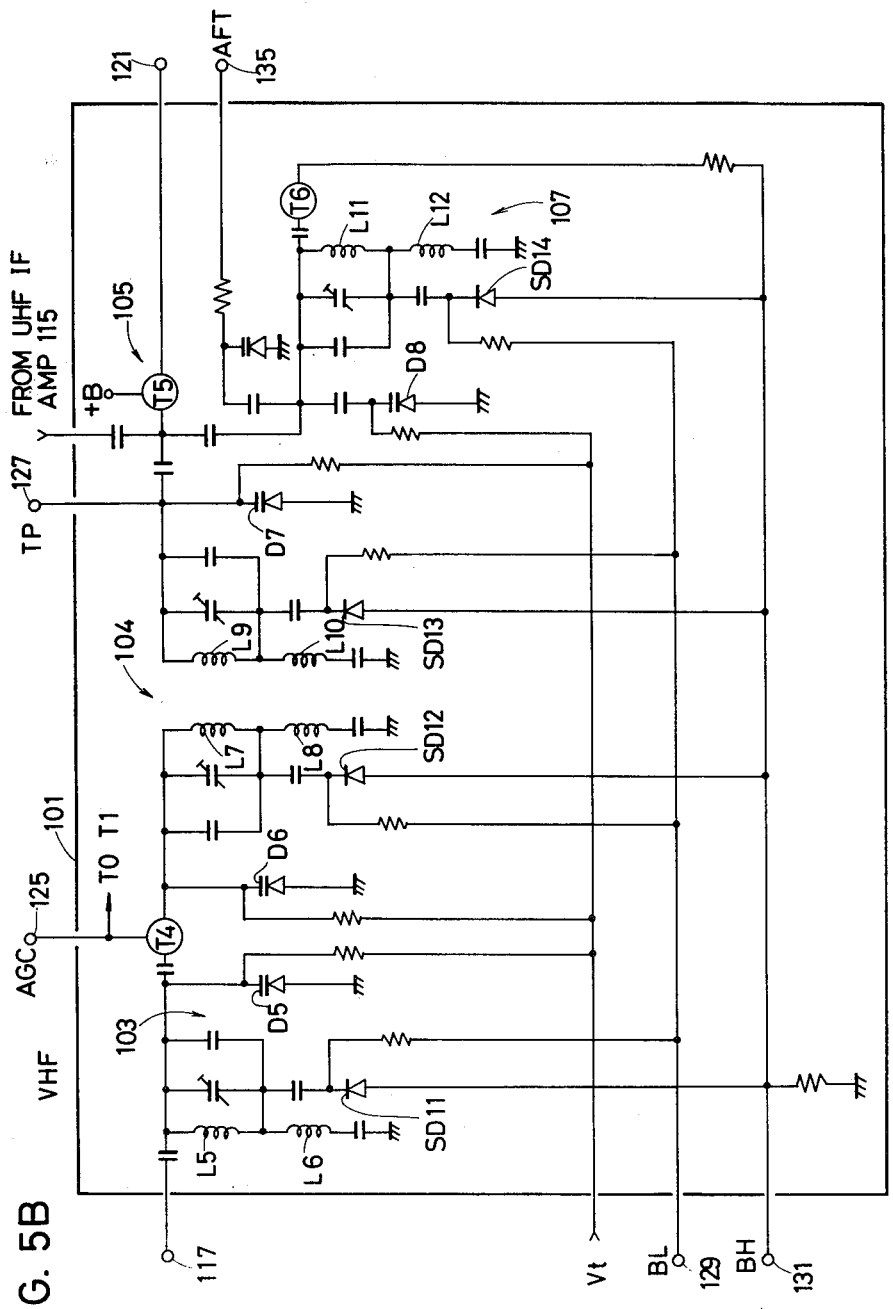

FIGS. 5A and 5B are schematic diagrams of an example of a television tuner in accordance with the present invention. FIG. 5A shows a UHF associated portion and FIG. 5B shows a VHF associated portion. These UHF and VHF portions are implemented in a unitary tuner housed within a single shield member 101; however, these portions are shown as housed in separate shield members 101 in FIGS. 5A and 5B for simplicity of illustration.

Referring to FIG. 5A, first the UHF portion will be described. The shield member 101 is partitioned into suitable cells by suitable shield plates. A UHF high frequency amplifier 109 including an input tuning circuit is provided within the first cell. An inter stage tuning circuit 110 is housed within the next cell and is disposed between the UHF high frequency amplifier 109 and a UHF mixer 111. A mixer diode Dm constituting a UHF mixer 111 is disposed within the same cell as the interstage tuning circuit 110. The UHF high frequency amplifier 109 comprises an input tuning circuit, which comprises a resonance circuit including a first voltage controlled variable capacitance diode D1 and a first resonance conductor L1. The resonance circuit serves to select a desired one of the broadcasting signals in the UHF band fed from the UHF antenna input terminal 119. An amplifying transistor T1 amplifies the selected UHF television signal. The amplified television signal is applied to a primary resonance circuit of the interstage tuning circuit 110. The primary resonance circuit comprises a second voltage controlled variable capacitance diode D2 and a second resonance conductor L2. The primary resonance circuit is electromagnetically coupled to the secondary resonance circuit. The secondary resonance circuit comprises a third voltage controlled variable capacitance diode D3 and a third resonance conductor L3. Accordingly, the television signal amplified by the transistor T1 is fed through the coupling between the primary resonance circuit and the secondary resonance circuit to the anode of the mixer diode Dm. On the other hand, the UHF local oscillator 113 comprises an oscillation transistor T2, a fourth voltage controlled variable capacitance diode D4 and a fourth resonance conductor L4. The oscillation output from the UHF local oscillator 113 is applied to the cathode of the mixer diode Dm. Accordingly, the mixer diode Dm serves to mix the two fed frequency signals, thereby to provide an UHF intermediate frequency signal, which is applied to an UHF intermediate frequency amplifier 115. The UHF intermediate frequency amplifier 115 comprises an amplifying transistor T3, the output of which is applied to a VHF mixer 105 shown in FIG. 5B. The tuning voltage Vt obtained from the tuning voltage terminal 123 of the tuner 100 is commonly applied to the first, second, third and fourth voltage controlled variable capacitance diodes D1, D2, D3 and D4 constituting the respective resonance circuits. The tuning voltage Vt is also applied to the VHF portion shown in FIG. 5B. An UHF band selecting voltage BU obtained from a terminal 133 is applied to the transistors T1, T2 and T3. Accordingly, these transistors T1 to T3 are enabled upon application of the voltage BU from the terminal 133.

Figure 6:
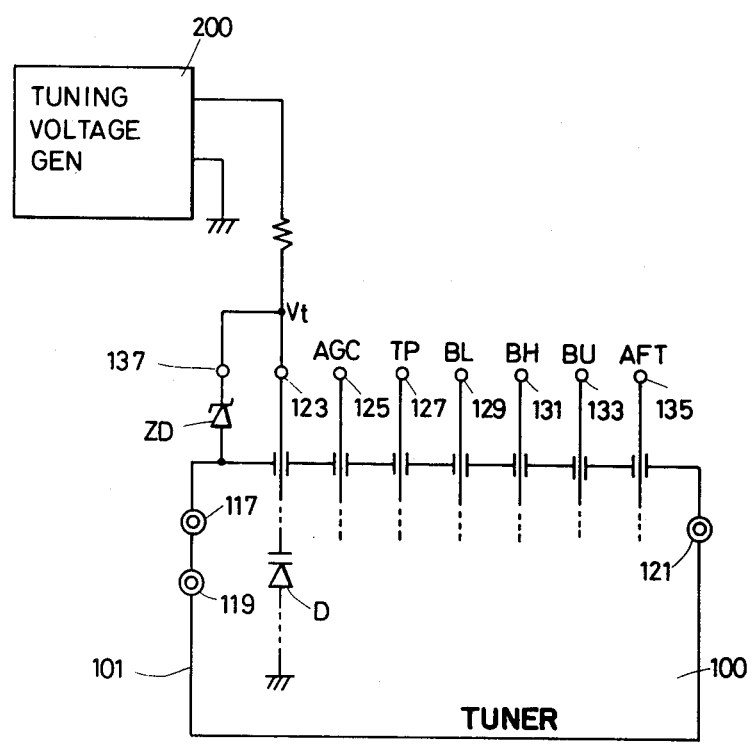
FIG. 6 is an outline view for explaining another embodiment of the present invention.

Frequency adjustment of the VHF portion is performed in the following manner. For the purpose of adjusting the tuning frequency by the UHF portion, first the Zener diode ZD is connected between the tuning voltage supply line and the shield member 101, as shown in FIGS. 4 and 6. Accordingly, the tuning voltage Vt obtained from the channel selecting apparatus, i.e. a variable tuning voltage generating means, not shown, has been adjusted to be the maximum voltage thereof. With the tuning voltage Vt adjusted to the highest voltage, the local oscillation frequency of the UHF local oscillator 113 is adjusted. Such frequency adjustment is made by a trimmer loop TL4 coupled to the fourth resonance conductor L4. The local oscillation frequency is adjusted such that the same may be within several MHz (within the frequencies corresponding to one channel at the highest) as compared with the normal local oscillation frequency of the highest receiving frequency channel of the UHF band. Thus, the highest receivable frequency of the UHF band at a predetermined upper limit tuning voltage restricted by the Zener diode ZD is determined. There-after the tuning voltage Vt obtained from the channel selecting apparatus, not shown, is lowered up to the lower limit. Then a trimmer capacitor Tc4 included in the UHF local oscillator 113 is adjusted, so that the normal local oscillation frequency of the lowest receiving frequency channel of the UHF band may be attained at that time. After the frequency of the UHF local oscillator 113 is thus adjusted, the input tuning circuit of the UHF high frequency amplifier 109 and the interstage tuning circuit 110 are adjusted so that the output of the UHF mixer 111 may be the normal intermediate frequency signal. More specifically, if and when the tuning voltage Vt is the upper limit voltage restricted by the Zener diode ZD, trimmer capacitors Tc5, Tc6 and Tc7 and the corresponding trimmer loops TL1, TL2 and TL3 are adjusted so that the normal intermediate frequency may be attained at the highest receiving frequency of the UHF band. Then the trimmer capacitors Tc1, Tc2 and Tc3 are adjusted so that when the tuning voltage Vt is brought to the lower limit the normal intermediate frequency may be attained at the receiving lowest frequency of the UHF band. In general, adjustment of the difference between the local oscillation frequency and the input tuning and interstage tuning resonance frequencies to be the normal intermediate frequency is referred to as tracking adjustment. Such tracking adjustment should be made not only in the UHF high end and the UHF low end band but also in the region therebetween. Such tracking adjustment in the intermediate region is made by the trimmer loops TL1, TL2 and TL3. The characteristic of the receiving frequency with respect to the tuning voltage Vt is thus determined as shown by the curve U in FIG. 2, for example. Then the characteristic of the receiving frequency in the UHF band with respect to the tuning voltage Vt is determined through adjustment of the UHF portion.

Referring to FIG. 5B, the VHF portion of the tuner 100 is shown. The VHF portion comprises a VHF high frequency amplifier 103. The VHF high frequency amplifier 103 comprises an input tuning circuit, which receives a VHF television signal from the VHF antenna input terminal 117. The input tuning circuit comprises inductors L5 and L6, and a voltage controlled variable capacitance diode D5 cooperating with these inductors for determining the tuning frequency of the resonance circuit. Furthermore, the VHF high frequency amplifier 103 comprises an amplifying transistor T4, the output of which is applied to the primary resonance circuit constituting an interstage tuning circuit 104. The primary resonance circuit comprises a voltage controlled variable capacitance diode D6 and inductors L7 and L8 which are coupled to a secondary resonance circuit. The secondary resonance circuit comprises inductors L9 and L10 and a voltage controlled variable capacitance diode D7. Accordingly, the VHF television signal selected by the input tuning circuit of the VHF high frequency amplifier 103 is amplified by the transistor T4 and is applied through the primary resonance circuit and the secondary resonance circuit of the interstage tuning circuit 104 to a transistor T5 constituting a VHF mixer 105. On the other hand, the VHF local oscillator 107 comprises an oscillation transistor T6, a voltage controlled variable capacitance diode D8, and inductors L11 and L12. Switching diodes SD11, SD12, SD13 and SD14 are coupled to the input tuning circuit included in the VHF high frequency amplifier 103, the primary resonance circuit and the secondary resonance circuit of the interstage tuning circuit 104 and the VHF local oscillator 107. A VHF low band selecting voltage BL is applied from a terminal 129 to the cathodes of these switching diodes SD11 to SD14, and a VHF high band selecting voltage BH is applied from a terminal 131 to the anodes of these switching diodes SD11 to SD14. Accordingly, when the VHF high band is to be selected, the inductors L6, L8, L10 and L12 are removed from the respective resonance circuits, because the corresponding switching diodes SD11, SD12, SD13 and SD14 are rendered conductive by the band selecting voltage BH. Meanwhile, the transistor T5 of the VHF mixer 105 is supplied with the operation voltage not only on the occasion of VHF reception but also on the occasion of UHF reception, whereby the transistor T5 serves as a UHF intermediate frequency amplifier on the occasion of UHF reception. The output of the VHF mixer 105 is applied to the terminal 121 as the intermediate frequency signal. Meanwhile, a terminal 127 serving as a test point is connected to the output of the secondary resonance circuit of the interstage tuning circuit 104. A terminal 135 for an automatic fine tuning voltage is provided in association with the VHF local oscillator 107 and the UHF local oscillator 113, although not shown. A terminal 125 for an automatic gain control voltage is provided to supply an automatic gain control voltage to the transistor T1 shown in FIG. 5A and the transistor T4 shown in FIG. 5B.

For the purpose of adjusting the characteristic of the receiving frequency of the VHF band with respect to the tuning voltage Vt, first the tuning voltage Vt is selected to be the highest voltage determined by the Zener diode ZD and the inductor L11 of the VHF local oscillator 107 is adjusted. Then, with the tuning voltage Vt adjusted to the lower limit, the inductor L11 is adjusted so that the lower limit frequency of the VHF high band may be adjusted. Then the inductors L5, L7 and L9 are adjusted to achieve tracking adjustment.

Now the voltage BL is applied for selecting the VHF low band. With the tuning voltage Vt selected to the highest voltage determined by the Zener diode ZD, the upper limit local oscillation frequency of the VHF low band is attained by adjusting the inductor L12. Then, with the tuning voltage Vt selected to the lower limit, the inductor L12 is adjusted such that the local oscillation frequency of the local oscillator 107 may be the lower limit frequency of the VHF low band. On the other hand, tracking adjustment is made by adjusting the inductors L6, L8 and L10. After the above described adjustment is made in each of the frequency bands, adjustment of the VHF band is made again to correct an influence caused by adjustment of the VHF low band.

Now a preferred adjustment range in the above described frequency adjustment will be described. Although description will be made of only the upper limit frequency, it is pointed out that the principle may also be applied to determination of the lower limit frequency to be described subsequently. Although in the following a description will be made of the adjustment for the UHF band in West Germany, the same consideration may be properly given in determining the upper limit frequency of the VHF high band in Canada, as necessary.

In making frequency adjustment, consideration is given to a temperature drift and a time dependent drift of the local oscillation frequency of the UHF local oscillator 113 and a pull-in frequency of an automatic fine tuning operation. More specifically, the temperature drift of the local oscillation frequency of the UHF local oscillator 113 in a tuner presently available is within ±1.5 MHz in the temperature variation range of −10° C. to −60° C. and a time dependent drift of the local oscillation frequency of the UHF local oscillator is within ±2 MHz, while the pull-in range of the automatic fine tuning operation is ±1.5 MHz. Accordingly, the highest receivable frequency in the VHF band may be determined to a frequency higher than the highest channel (E69) by 2 MHz. By selecting the highest frequency in the above described manner, the total sum (+7 MHz) of the temperature drift (+1.5 MHz)+the time dependent drift (+2 MHz)+the pull-in range of the automatic fine tuning operation (+1.5 MHz) and the above described 2 MHz would be a frequency range which involves a possibility of deviation toward a higher frequency exceeding the above described highest receiving channel. Since the frequency range allowed for the upper limit of the UHF channel in West Germany is 8 MHz, it follows that there is still a margin of 1 MHz even in the worst situation in consideration of the above described various drifts and the pull-in range and accordingly the tuner thus implemented still suffices to meet the requirement of the FTZ standard. Even when the temperature drift and the time dependent drift have exerted an influence upon a lower frequency, such drifts would be −1.5 MHz and −2 MHz, respectively. Since adjustment has beed made to a frequency higher than the normal frequency of the highest channel by 2 MHz in making the above described adjustment, no problem is caused in reception of the highest channel.

FIG. 6 is similar to FIG. 4 but shows an outline view showing another embodiment of the present invention. More specifically, in the FIG. 4 embodiment, the Zener diode ZD was directly connected between the shield member 101 and the tuning voltage supply terminal 123. However, in the FIG. 6 embodiment, a separate terminal 137 is provided in the tuner 100. The Zener diode ZD is connected between the above described additional terminal 137 and shield member 101. The terminal 137 is connected to the terminal 123, thereby to commonly receive the tuning voltage Vt from the tuning voltage generating circuit 200. The tuning voltage generating circuit 200 may be a channel selecting apparatus and a typical example thereof will be described subsequently with reference to FIGS. 7 to 9. By thus providing the separate terminal 137 and by connecting the Zener diode ZD between the terminal 137 and the shield member 101, the previously described adjustment of the frequency can be made with simplicity. Meanwhile, the terminals 125, 127, 129, 131, 133 and 135 in the FIG. 6 diagram are the same as those corresponding ones shown in the FIG. 1 diagram.

Figure 7:
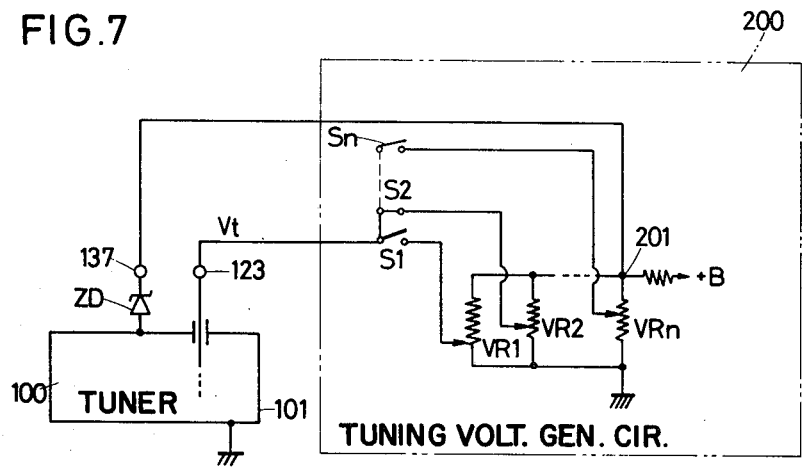
FIGS. 7, 8 and 9 are outline views for depicting different embodiments of the present invention wherein different types of channel selecting apparatuses, i.e. variable tuning voltage generating means are employed, respectively.

FIG. 7 is a schematic diagram showing one example of a channel selecting apparatus employed as a variable tuning voltage generating means. The channel selecting apparatus 200 shown in FIG. 7 is well-known to those skilled in the art as a channel selecting apparatus of the so-called preset type. More specifically, a plurality of tuning voltage setting variable resistors VR1 to VRn are provided corresponding to Channel Nos. 1 to n being received. These variable resistors VR1, VR2, ... VRn are commonly supplied with the source voltage +B. The sliding contacts of these variable resistors VR1, VR2, ... VRn are connected through the corresponding channel selection switches S1, S2, ... Sn, commonly to the terminal 123 of the tuner 100. Accordingly, when the channel selection switch S1 is turned on, for example, the tuning voltage Vt for selecting Channel No. 1 set by the variable resistor VR1 is applied to the terminal 123 and accordingly is applied to the voltage controlled variable capacitance diode (FIGS. 4 and 6). In the embodiment shown, the terminal 137 connected to the Zener diode ZD is connected to the voltage supply line 201. Accordingly, the maximum value of the tuning voltage Vt obtained from the variable resistors VR1 to VRn is restricted by means of the Zener diode ZD and accordingly the voltage controlled variable capacitance diode is prevented from being supplied with an undesirably range tuning voltage and the tuning frequency is prevented from deviating toward a higher frequency off the prescribed standard.

Figure 8:
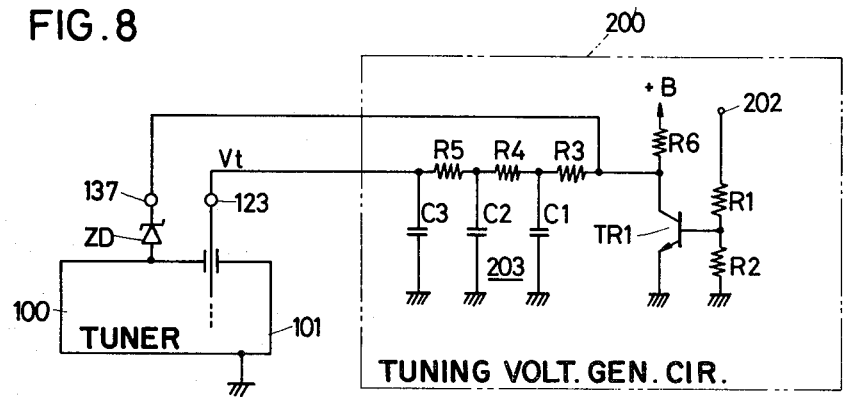

FIG. 8 is a schematic diagram showing a major portion of another example of a channel selecting apparatus for use in the present invention. The example shown comprises a channel selecting apparatus or a tuning voltage generating circuit 200 of a voltage synthesizer type. More specifically, although not shown, the channel selecting apparatus 200 comprises a pulse train signal generating means for generating a pulse train signal including the pulses of the number corresponding to the channel being selected. Such pulse train signal is applied from a terminal 202 through resistors R1 and R2 to the base electrode of a switching transistor TR1. Accordingly, the switching transistor TR1 is rendered non-conductive during a time period of the pulse being applied from the terminal 202. Therefore, a pulsive current is supplied from a direct current voltage source +B through a resistor R6 to a smoothing circuit 203 implemented by resistors R3, R4 and R5 and capacitors C1, C2 and C3. Accordingly, the smoothing circuit 203 serves to smooth the pulsive current and the smoothed output is applied to the terminal 123 of the tuner 100 as the tuning voltage Vt. In the case of the embodiment shown, the terminal 137 connected to the Zener diode ZD is connected to the collector electrode of the transistor TR1. Therefore, the voltage at the collector electrode is restricted by the constant voltage Zener diode ZD and accordingly the upper limit of the tuning voltage Vt obtained from the smoothing circuit 203 is also restricted. Meanwhile, such channel selecting apparatus of a voltage synthesizer type is disclosed in U.S. Pat. No. 3,968,440, issued July 6, 1976 to George John Ehni, III, for example.

Figure 9:
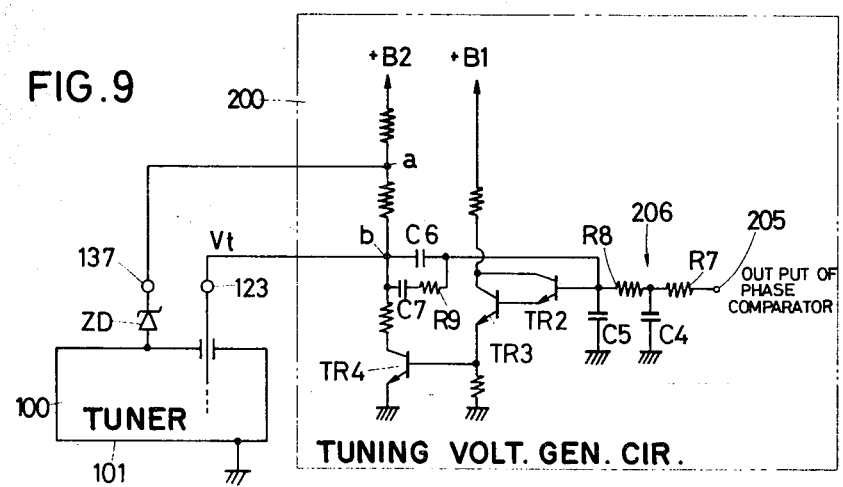

FIG. 9 is a schematic diagram showing the major portion of a further example of a channel selecting apparatus for use in the present invention. The example shown comprises a channel selecting apparatus 200 of a frequency synthesizer type. A channel selecting apparatus of a frequency synthesizer type disclosed in U.S. Pat. No. 4,081,752, issued Mar. 28, 1978 to Yasuaki Sumi, for example, and comprises a phase comparator, not shown, for phase comparison of the local oscillation frequency signal in the tuner 100 and the reference frequency signal. The comparison output voltage from the phase comparator, not shown, is applied through a terminal 205 to a smoothing circuit or a lowpass filter 206 implemented by resistors R7 and R8 and capacitors C4 and C5. The output from the lowpass filter 206 is subjected to impedance conversion by means of transistors TR2 and TR3 and is then amplified by a transistor TR4, whereupon the output is applied from the junction b to the terminal 123 of the tuner 100 as the tuning voltage Vt. The above described transistors TR2 and TR3 are supplied with the operation voltage +B1 and the transistor TR4 is supplied with the operation voltage +B2. Three resistors are connected in series between the source voltage +B2 and the collector electrode of the transistor TR4, with junctions a and b formed between the resistors. In the example shown, the terminal 137 connected to the Zener diode ZD of the tuner 100 is connected to the junction a of the channel selecting apparatus 200. Accordingly, the upper limit of the source voltage +B2 of the channel selecting apparatus 200 is restricted. Therefore, the voltage at the junction b where the tuning voltage Vt is to be withdrawn is also prevented from exceeding the voltage restricted by the Zener diode ZD. Referring to FIG. 9, capacitors C6 and C7 and a resistor R9 are coupled to the base electrode of the transistor TR2 so as to negative feedback the output of the transistor TR4 thereto, thereby to constitute a negative feedback circuit for removing a ripple.

In the case of the embodiments shown in FIGS. 4, 5A, 5B and 6, the Zener diode ZD is normally in a non-conduction state and is rendered conductive when the tuning voltage Vt exceeds a predetermined value, whereby the tuning voltage Vt is restricted to the predetermined value. By contrast, in the case of the embodiments shown in FIGS. 7 to 9, the Zener diode ZD is connected to the voltage supply line and is normally in a conduction state, which is a different point from the previously described embodiments; however, both embodiments perform the same effect for restricting the tuning voltage Vt applied to the terminal 123 of the tuner 100 to a predetermined value. In implementing such embodiments, it is effective to provide in the tuner 100 the terminal 137 described in conjunction with FIG. 6. More specifically, on the occasion of frequency adjustment, the terminal 137 is connected to the terminal 123 and in installing the tuner 100 in a television receiver, the terminal 137 is disconnected from the terminal 123 and is connected to a predetermined position of the channel selecting apparatus 200, as shown in FIGS. 7 to 9. Accordingly, frequency adjustment can be made with ease.

Figure 1:
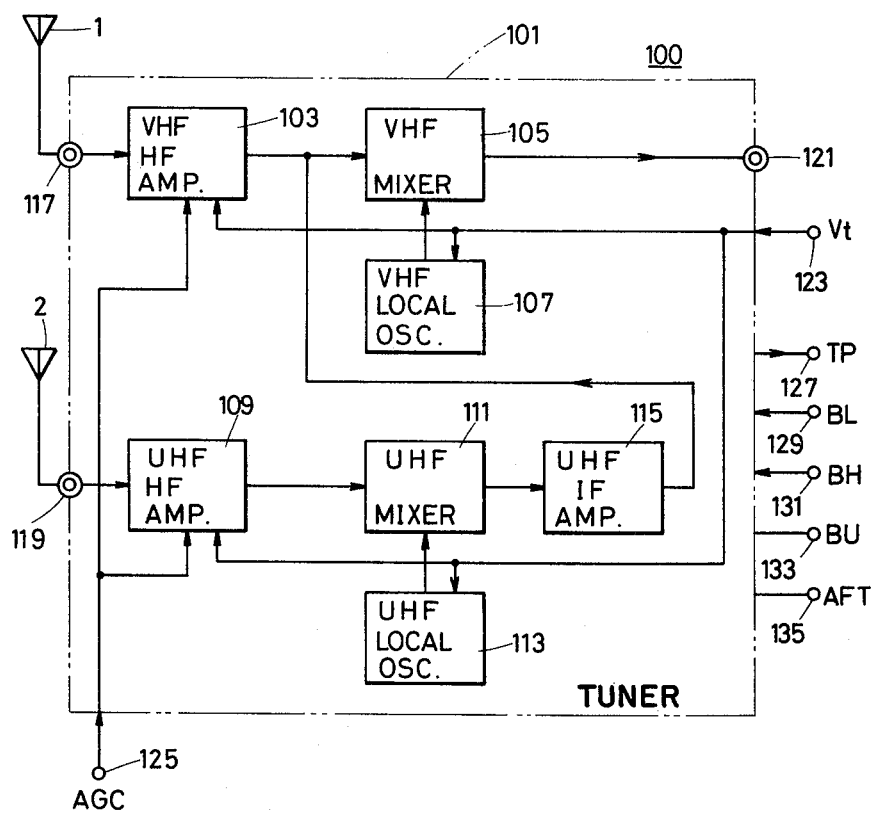
FIG. 1 is a block diagram showing one example of a conventional television tuner wherein the present invention can be advantageously employed.

In the foregoing, description was made of the embodiments wherein the upper limit of the tuning frequency was restricted in such a television tuner as shown in FIG. 1 so as not to exceed the requirement provided in the FTZ, DOC, and the like. It would be appreciated that the above described embodiments effectively perform the above described function in such a tuner. Now in the following an embodiment will be described wherein restriction is made not only at the upper limit of the frequency but also at the lower limit of the frequency so that the frequency may not become lower than a predetermined frequency.

FIG. 10 is an outline block diagram showing another embodiment of the present invention. The embodiment shown is aimed to restrict the tuning voltage Vt so as not to become lower than a predetermined value, thereby to restrict the tuning frequency so as not to become lower than a predetermined value. More specifically, a tuning voltage supply path 207 is provided so that the tuning voltage Vt obtained from the channel selecting apparatus 200 shown in FIGS. 7 to 9 may be applied to the terminal 123. As disclosed in the previously referenced U.S. Pat. No. 3,968,440, the channel selecting apparatus 200 is also adapted to generate band selecting voltages, which are applied through the respective paths 208, 209 and 210 to the corresponding band selecting voltage terminals 129, 131 and 133, thereby to receive the VHF low band selecting voltage BL, the VHF high band selecting voltage BH and the UHF band selecting voltage BU, respectively. A lower limit constant voltage forcing means 300 including constant voltage generating means 31, 32 and 33 is connected between these band voltage supply paths 208, 209 and 210 and the ground. The constant voltages obtained from the constant voltage generating means 31, 32 and 33 are applied through the corresponding switching diodes SD1, SD2 and SD3 commonly to the tuning voltage supply path 207 and thus to the terminal 123. The terminal 137 connected to the Zener diode ZD is also connected to the path 207. Accordingly, the upper limit of the tuning voltage Vt is also restricted by the Zener diode ZD, as described previously.

On the other hand, a voltage of +15 V is obtained from the channel selecting apparatus 200 at any one of the band selecting voltage paths 208, 209 and 210 depending on the band to which the channel being selected pertains. Accordingly, the tuner 100 is responsive to the band selecting voltage to control the structure of the tuning circuit, not shown, i.e. the circuit component constant and the connection thereof so as to be adaptable to the frequency band. On the other hand, the corresponding one of the band selecting voltages BL, BH and BU is applied to the corresponding constant voltage generating means 31, 32 or 33. For example, assuming that the VHF low band is selected, the voltage of +15 V is applied to the constant voltage generating means 31. The constant voltage generating means 31 is responsive to the given voltage to provide a predetermined voltage of say +3 V. When the tuning voltage Vt obtained at the tuning voltage supply path 207 is higher than the predetermined voltage, say +3 V, the corresponding switching diode SD1 is reverse biased and is rendered non-conductive, with the result that the tuning voltage Vt generated from the channel selecting apparatus 200 is as such applied to the terminals 123 and 137. However, when the tuning voltage Vt is lower than the predetermined voltage, the switching diode DS1 is forward biased and is rendered conductive. Accordingly, not the tuning voltage obtained from the tuning voltage supply path 107 but the predetermined voltage of say +3 V from the predetermined voltage generating means 31 is applied to the terminals 123 and 137. Therefore, the voltage being applied to the terminal 123 and thus to the voltage controlled variable capacitance diode (FIG. 4) is prevented from becoming lower than the predetermined voltage. As a result, the tuning circuit is prevented from giving rise to a frequency lower than the frequency tunable by the said predetermined voltage, say the frequency corresponding to the lowest channel of the VHF low band. It would be appreciated that such restriction at the lower limit of the tuning frequency can be made even in the case of the VHF high band and in the case of the UHF band. Accordingly, in the case where it is necessary to restrict the lower limit of the VHF high band as in Canada, for example, the predetermined voltage generating means 32 and the switching diode SD2 function to restrict the lower limit frequency of the VHF high band as described in the foregoing. Meanwhile, the terminals 125 and 127 in the FIG. 10 diagram are the same as the corresponding ones shown in the FIG. 1 diagram.

FIG. 11 is a block diagram showing in more detail the FIG. 10 embodiment. Referring to FIG. 11, the above described predetermined voltage generating means 31, 32 and 33 each comprise variable resistors 311, 321 and 331. The variable resistor 31 is connected at both ends to current limiting resistors 312 and 313, the variable resistor 321 is connected at both ends to resistors 322 and 323, and the variable resistor 331 is connected at both ends to the resistors 332 and 333. The sliding contacts of the variable resistors 311, 321 and 331 are connected through the corresponding switching diodes SD1, SD2 and SD3 to the tuning voltage supply path 207. In the FIG. 11 embodiment, by properly setting the sliding contacts of the variable resistors 311, 321 and 331 to the respective suitable positions, the respective tunable lowest frequencies in the respective frequency bands, i.e. in the VHF low band, the VHF high band and the UHF band, can be arbitrarily set. Meanwhile, the switching diodes SD1, SD2 and SD3 function to prevent interferences between the output of the channel selecting apparatus 200 and the constant voltage generating means 31, 32 and 33 and also to prevent mutual interferences among the respective means 31, 32 and 33. Meanwhile, the terminals 123, 125, 127, 129, 131, 133 and 137 in the FIG. 11 diagram are the same as those corresponding ones shown in the FIG. 10 diagram and the Zener diode ZD also performs the same function as that of the corresponding one shown in FIG. 10.

Referring to FIG. 11, a diode 207a is interposed in the tuning voltage supply path 207. The diode 207a is provided to prevent the tuning voltage Vt from being influenced by the lower limit constant voltage forcing circuit 300 when the output impedance of the channel selecting apparatus 200 is small. More specifically, in the case where the output impedance of the channel selecting apparatus 200 is small, the predetermined voltage obtained from the lower limit constant voltage forcing circuit 300 causes a current to flow toward the apparatus 200 rather than to the terminal 123, whereby a situation could occur that a voltage being applied to the voltage controlled variable capacitance diode included in the tuner undesirably decreases. However, since such diode 207 is interposed in the tuning voltage supply path 207, such influence is effectively interrupted. Accordingly, if the output impedance of the channel selecting apparatus 200 is sufficiently larger than the output impedance of the circuit 300, such diode 207a should be unnecessary. The drop of the tuning voltage Vt across the diode 207a changes depending on the ambient temperature, which results in a drift of the tuning frequency by the tuner. However, such drift can be readily eliminated by providing a temperature compensation of the tuning voltage Vt or by designing such that a drift of the tuning frequency by the tuner may be reversed to a drift of the tuning frequency by the diode 207a. Furthermore, by providing the switching diodes SD1 to SD3 and the diode 207a inside the tuner 100, the temperature drift of the tuning frequency by the tuner, including a drift dependent on the temperature characteristic of the diode 207a, can be compensated.

In order to meet the requirement in the FTZ standard in West Germany, for example, the embodiment shown in FIGS. 10 and 11 may be adapted as described in the following. More specifically, according to the provision in the FTZ standard, the tuning freuqency of a tuner may be allowed within the frequency range covering a frequency lower than the lower limit of 47 MHz of the VHF low band by 7 MHz. Accordingly, in West Germany, considering a variation of the ambient temperature and a fluctuation of the source voltage, and the pull-in range of the automatic fine tuning, it is sufficient to set the lower limit of the tuning voltage of the VHF low band being restricted so that normally the frequency may be lower than 47 MHz by 3 to 5 MHz.

Figure 12:
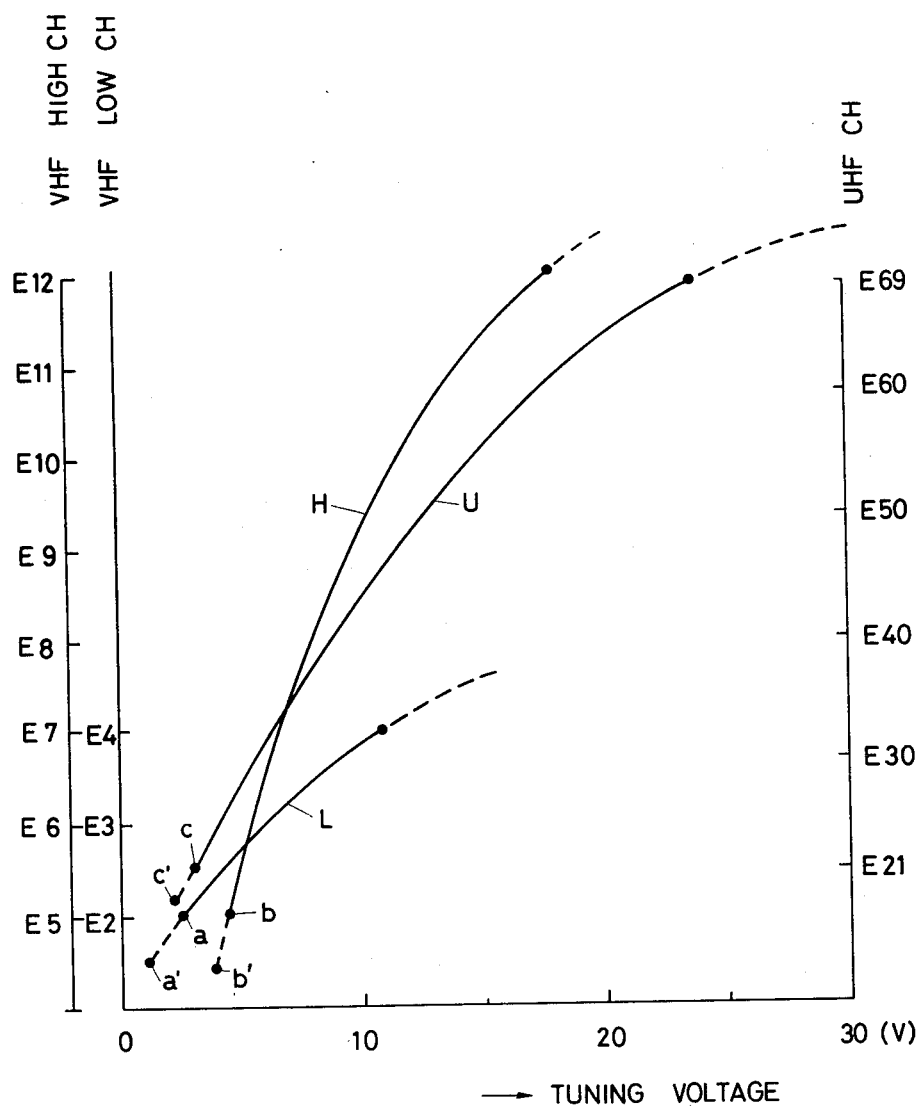
FIG. 12 is a graph showing a relation between the tuning voltage and the frequency (the receiving channels) for explaining the embodiments shown in FIGS. 10 and 11.

FIG. 12 is a graph showing a relation between the tuning voltage for a television receiver and the receiving channels (frequency) in West Germany and corresponds to the FIG. 2 graph. As seen from FIG. 12, according to the embodiments shown in FIGS. 10 and 11, the lower limits of the respective frequencies in the respective frequency bands, i.e. the VHF low band, the VHF high band and the UHF band, are restricted to a', b' and c', respectively.

Figure 13:
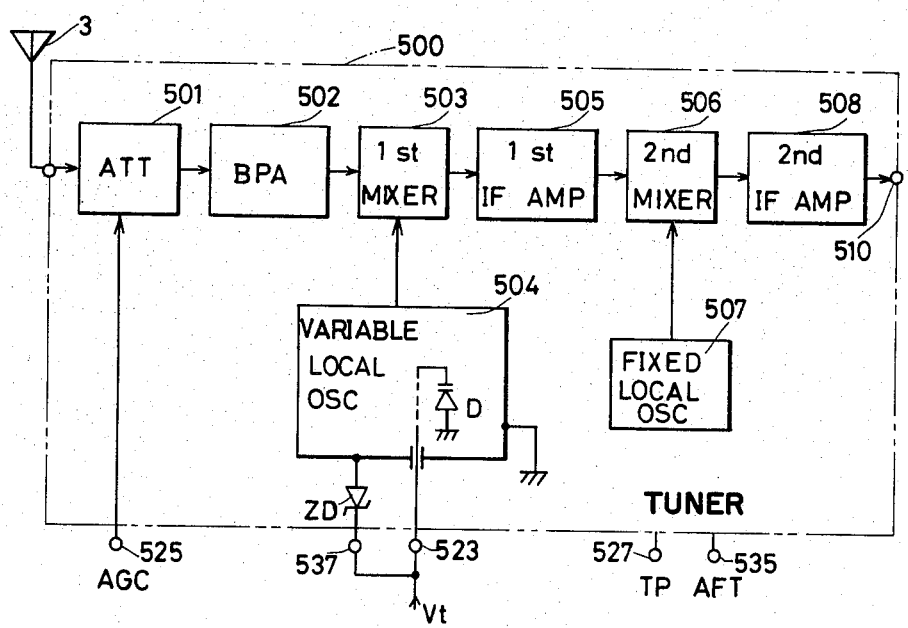
FIG. 13 is a block diagram showing a further embodiment of the inventive television tuner.

FIG. 13 is a block diagram showing another example of a tuner wherein the present invention can be advantageously practiced. The FIG. 13 example is well-knwon as a tuner of the so-called double conversion type or double superheterodyne type. The tuner of a doube conversion type is disclosed in U.S. Pat. No. 3,639,840, issued Feb. 1, 1972 to Jacob Shekel et al and entitled "Multi-carrier Transmission System".

In the case where such double conversion type tuner is employed as a television tuner, a UHF television signal and VHF television signal can be received by the same circuit, while only one variable capacitance diode may be used in a tuning circuit, which is an advantage from the standpoint of cost. Furthermore, another advantage is brought about that a gain non-uniformity in the recieving band width is small, so that a noise index characteristic in the VHF band is also enhanced.

The tuner 500 comprises an attenuator 501 for attenuating a UHF and VHF television signal received by the antenna 3 in association with an automatic gain control voltage obtained at a terminal 525 from the intermediate frequency amplifier (not shown). The attenuator 501 employs a PIN diode, which is controlled by means of a drive circuit (not shown) receiving the automatic gain control voltage. The attenuator 501 is used to particularly attenuate an interference signal influencing a desired received signal and is adapted to start operating from approximately 70 dB in terms of the receiving electric field intensity. The output of the attenuator 501 is applied further through a wide band amplifier 502 to a first mixer 503. If desired, a bandpass filter associated with a high band and low band in the VHF band and a UHF band may be switchably provided before the wide band amplifier 502. The first mixer 503 is also supplied with a local oscillation signal from a variable local oscillator 504 through a buffer amplifier (not shown). The variable local oscillator 504 comprises a variable capacitance diode D and is adpated to make oscillation at the frequency range of approximately 2,000 to 3,000 MHz in response to the tuning voltage obtained at a terminal 523 from the channel selecting apparatus. Accordingly, the frequency sum of the television signal and the oscillation signal obtained from the variable local oscillator 504 is evaluated by the first mixer 503 and the output thereof is applied through the intermediate frequency amplifier 505 to a second mixer 506. The second mixer 506 is further supplied with a local oscillation signal obtained from a fixed local oscillator 507 providing an oscillation signal of a constant frequency of about 2,000 MHz, for example. Accordingly, the second mixer 506 provides a beat between the output of the first mixer 503, i.e. the first intermediate frequency signal, and the local oscillation signal obtained from the fixed local oscillator 507, which output is applied to a subsequent stage intermediate frequency amplifier 508 as a second intermediate frequency signal, which corresponds to the output of the mixer 105 shown in FIG. 1, for example.

Even in the FIG. 13 embodiment, the upper limit of the tuning voltage Vt being applied to the voltage controlled variable local oscillator 504 is restricted by the Zener diode ZD. More specifically, the Zener diode ZD is connected at the anode to the ground and at the cathode to the tuning voltage terminal 523. Accordingly, if and when the tuning voltage Vt being applied to the terminal 523, i.e. the voltage being applied to the voltage controlled variable capacitance diode D exceeds a predetermined value, the Zener diode ZD is rendered conductive, whereby the tuning voltage Vt is restricted to be lower than the predetermined voltage. Referring to the FIG. 13 diagram, the terminals 525, 527 and 535 corresponding to the terminals 125, 127 and 135, respectively, shown in the FIG. 1 diagram.

Figure 14:
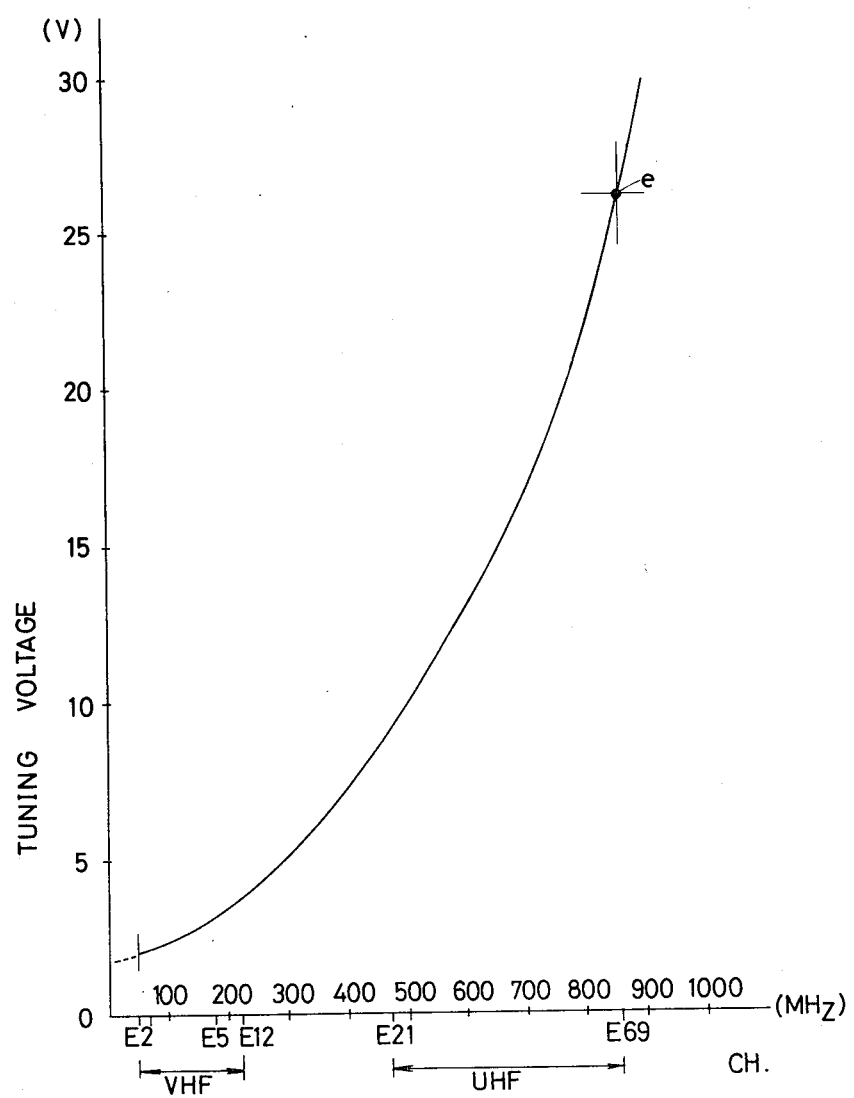
FIG. 14 is a graph showing a relation between the frequency (the receiving channels) and the tuning voltage of the FIG. 13 embodiment.

FIG. 14 shows a relation between the broadcasting channels (frequencies) in West Germany and the tuning voltage in accordance with a television tuner of the FIG. 13 embodiment. Referring to FIG. 14, the abscissa indicates the channel numbers (frequencies) and the ordinate indicates the tuning voltage. Referring to FIG. 14, the point e denotes the upper limit of the tuning voltage being restricted by the Zener diode ZD. More specifically, as seen from FIG. 14, even in the case of the FIG. 13 embodiment, the upper limit of the tuning voltage Vt, i.e. the upper limit of the voltage being applied to the voltage controlled variable capacitance diode D is restricted so as not to be higher than the predetermined value, and therefore the receivable frequency range is restricted within the range required by the FTZ standard.

Figure 15:
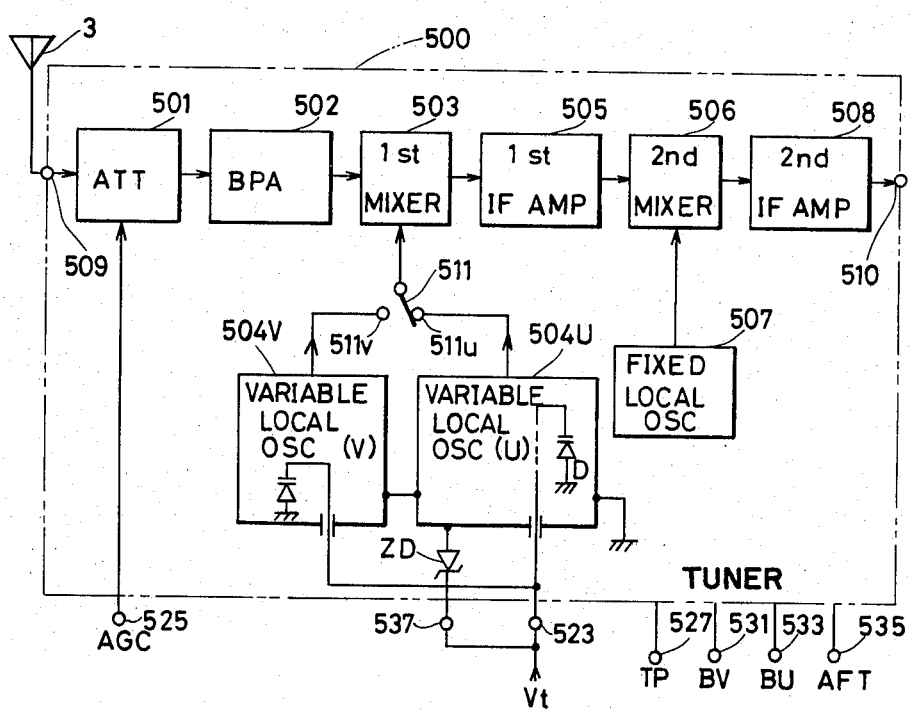
FIG. 15 is a block diagram showing a modification of the FIG. 13 embodiment.

FIG. 15 is a block diagram showing a modification of the FIG. 13 embodiment. As in the case of the FIG. 13 embodiment, in a double conversion type television tuner, the tuning freuqency is changed to be receivable over a wide range from the VHF low band to the UHF band by a single voltage controlled variable local oscillator 504. However, in achieving such a wide range of the tuning frequency using only a single voltage controlled variable local oscillator, a difficulty is caused in the local oscillator 504 and in order to prevent such difficulty two voltage controlled variable local oscillators 504V and 504U have been employed in the FIG. 15 embodiment. More specifically, the variable local oscillator 504V is used for the VHF band and is adapted to be variable over the frequency range from 2,000 to 2,350 MHz. On the other hand, the voltage controlled variable local oscillator 504U is provided for the UHF band and is adapted to be variable over the frequency range from 2,500 to 2,900 MHz, for example. The oscillation outputs of these two variable local osicllators 504V and 504U are applied to the contacts 511V and 511U of a band selecting switch 511. The switch 511 is switched responsive to the band selecting voltages BV and BU being applied to band selecting voltage terminals 531 and 533 provided in the tuner 500. More specifically, if and when the VHF band selecting voltage BV for selecting the VHF band is applied from the channel selecting apparatus, not shown, to the terminal 531, the switch 511 is turned to the contact 511V. On the other hand, if and when the UHF band selecting voltage BU is applied from the terminal 533, the switch 511 is turned to the contact 511u. Accordingly, when the VHF band is to be selected, the oscillation output from the variable local oscillator 504V is applied to the first mixer 503. Conversely, if the UHF band is to be selected, the oscillation output from the variable local oscillator 504U is applied to the first mixer. Referring to FIG. 15, the terminals 523, 525, 527, 535 and 537 are the same as those corresponding ones shown in FIG. 13.

Figure 16:
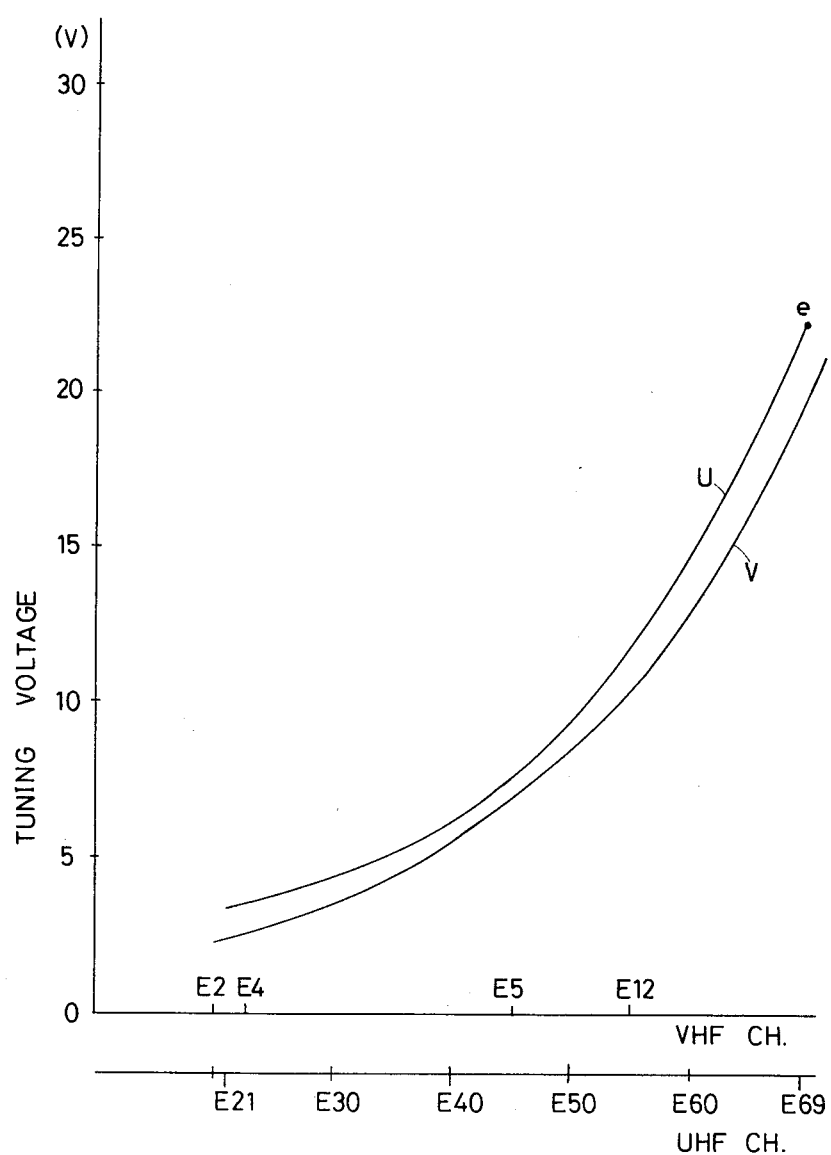
FIG. 16 is a graph showing a relation between the frequency (receiving channels) and the tuning voltage of the FIG. 15 embodiments.

FIG. 16 is a graph showing a relation between the broadcasting channels (frequencies) and the tuning voltage in the case where the FIG. 15 embodiment is employed as a television tuner for the West Germany standard. Referring to FIG. 16, the abscissa indicates the respective channels in the VHF band and the UHF band and the ordinate indicates the tuning voltage. Since the upper limit of the voltage being applied to the voltage controlled variable capacitance diode D included in the variable local oscillator 504U is restricted by the Zener diode ZD in the FIG. 15 embodiment, the receivable frequency is restricted at the point e, as shown by the curve U in FIG. 16.

In utilizing the FIG. 15 embodiment to meet the requirement of the Canadian standard, i.e. so as to restrict the upper limit of the VHF high band, the Zener diode ZD may be adapted such that the upper limit of the voltage being applied to the variable capacitance diode D included in the variable local oscillator 504V may be restricted.

Figure 17:
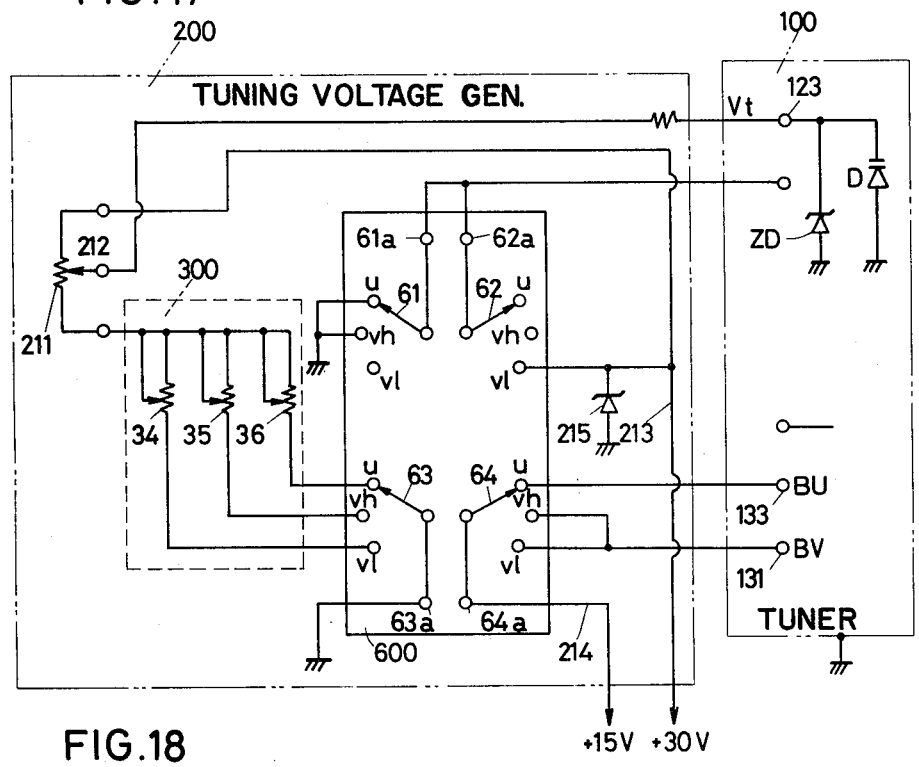
FIGS. 17 and 18 are outline views for depicting further embodiments of the present invention, respectively.

FIG. 17 is a schematic diagram of a major portion of a further embodiment of the present invention. The FIG. 17 embodiment comprises a channel selecting apparatus 200 adapted to provide a tuning voltage Vt by means of a single variable resistor 212 to cover the VHF low band, VHF high band and the UHF band. To that end, the channel selecting apparatus 200 comprises a switch circuit 600 for selection of the frequency bands. The switch circuit 600 comprises first to fourth switches 61 to 64 coupled in a ganged fashion to each other. A terminal 61a associated with the sliding contact of the switch 61 and a terminal 62a associated with the sliding contact of the switch 62 are commonly connected to a switching voltage supply terminal included in the tuner 100. A VHF high band contact vh and a UHF band contact u of the switch 61 are commonly connected to the ground, while a VHF low band contact vl of the switch 61 is not connected anywhere. The VHF low band contact vl of the switch 62 is connected to the voltage supply line 213 of +30 V, while the remaining contacts vh and u are not connected anywhere. A Zener diode 215 is connected between the voltage supply line 213 of +30 V and the ground. The Zener diode 215 is aimed to maintain the voltage of the voltage supply line 213 to a predetermined value, i.e. +30 V. A terminal 63a associated with the sliding contact of the switch 63 is connected to the ground and a contact 64a associated with the sliding contact of the switch 64 is connected to the voltage supply line 214 of +15 V. A VHF low band contact vl, a VHF high band contact vh and a UHF band contact u of the switch 63 are connected to the corresponding variable resistors (semifixed resistors) 34, 35 and 36, respectively, included in a lower limit constant voltage forcing means 300. The switch 64 serves as a switch for providing a band selecting voltage to the tuner and the VHF low band contact vl and the VHF high band contact vh of the swtich 64 are commonly connected to a terminal 131 of the tuner (corresponding to the terminal 531 in FIG. 5). The UHF contact u of the switch 64 is connected to a terminal 133 of the tuner 100. Accordingly, as the switch circuit 600 is turned, the terminal 131 is supplied with the VHF band selecting voltage BV and the terminal 133 is supplied with the VUH band selecting voltage BU.

The respective other terminals and the respective sliding contacts of the semifixed resistors 34, 35 and 36 included in the lower limit constant voltage forcing circuit 300 are commonly connected to one terminal of the tuning voltage setting variable resistor 211. The other terminal of the variable resistor 211 is connected to the voltage supply line 213 and the sliding contact of the variable resistor 211 is connected to the terminal 123 of the tuner to supply the tuning voltage Vt. A Zener diode ZD is connected to the terminal 123, as in the case of the previously described embodiments, so that the upper limit voltage of the tuning voltage Vt is restricted.

The semifixed resistors 34, 35 and 36 are aimed to set the respective lower limits of the receivable frequencies in the corresponding frequency bands, i.e. the VHF low band, the VHF high band and the UHF band. For example, assuming that the VHF low band is selected and the sliding contact of the variable resistor 211 is set to the lowest position to make zero the resistance value by the variable resistor 211, then the voltage dependent on the variable resistor determined by the corresponding semifixed resistor 34 is applied to the terminal 123 as the tuning voltage Vt. The voltage at that time, i.e. the tuning voltage Vt based on the resistance value determined by the semifixed resistor 34 determines the lower limit of the receiving frequency in the VHF low band. Similarly, as for the VHF high band and the UHF band, the lower limits of the receivable frequencies in the respective frequency bands are restricted by properly setting the respective semifixed resistors 35 and 36. Although FIG. 17 was illustrated to show the switch circuit 600 as implemented by a mechanical switch for simplicity of illustration, it is needless to say that the switch 600 may be structured with electronic switching devices using semiconductor circuitry.

Figure 18:
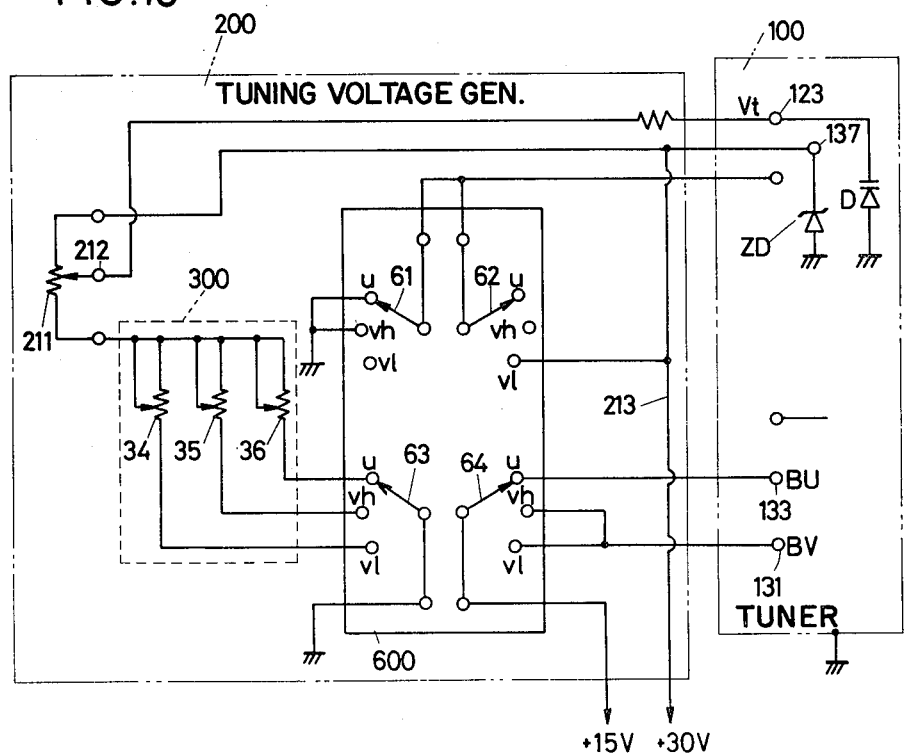

FIG. 18 shows a modification of the FIG. 17 embodiment. In the case of the FIG. 18 embodiment, the Zener diode ZD is connected to the terminal 137 of the tuner 100, as previously shown in FIG. 6, for example. The terminal 137 and thus the Zener diode ZD is also connected to the voltage supply line 213 of +30V. Accordingly, the Zener diode ZD serves to restrict the upper limit voltage of the voltage supply line 213 for the purpose of restricting the upper limit of the tuning voltage Vt, as in the case of the embodiments shown in FIGS. 7 to 9. With such modification, the Zener diode 215 required in the FIG. 17 embodiment can be dispensed with. More specifically, the Zener diode ZD performs two function of stabilizing the voltage supply line 213 and restricting the upper limit of the receiving frequency.

Referring to the embodiments shown in FIGS. 17 and 18, the lower limit being restricted of the receiving frequency in the respective bands may be set in the same manner as in the case of the embodiments shown in FIGS. 10 and 11. More specifically, in the case of a television tuner in accordance with the West Germany standard, the lower limit may be set several MHz lower than the lowest receiving channel E2 in the VHF low band. By doing so, even in consideration of a temperature drift, a time dependent drift and a pull-in frequency of the automatic fine tuning, the lower limit frequency of the VHF low band does not deviate from the requirement of FTZ standard. The same applies to the setting of the lower limit frequency of the VHF high band in Canada.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuner apparatus, comprising:
    a voltage controlled variable reactance means the reactance of which varies as a function of a control voltage being applied thereto,
    a tuner means comprising a tuning circuit including said voltage controlled variable reactance means, said tuning circuit having a tuning frequency variation characteristic dependent upon the variation of the reactance of said voltage controlled variable reactance means,
    variable tuning voltage generating means coupled to said voltage controlled variable reactance means for generating a variable tuning voltage and applying said tuning voltage to said voltage controlled variable reactance means as said control voltage therefor, wherein the variation range of said variable tuning voltage is selected such that the variation of the tuning frequency over a desired receiving frequency band is defined by a predetermined upper limit frequency and a predetermined lower limit frequency and wherein a plurality of receiving channels are distributed between said upper limit frequency and said lower limit frequency, and
    upper limit constant voltage limiting means for limiting to a predetermined upper limit voltage said variable tuning voltage applied to said voltage controlled variable reactance means by said variable tuning voltage generating means when said variable tuning voltage exceeds said predetermined upper limit voltage, said predetermined upper limit voltage being selected such that said tuning circuit is tuned to a tuning frequency falling within a predetermined upper frequency range associated with said upper limit frequency of said desired receiving frequency band, wherein said upper limit constant voltage limiting means is provided in said tuner apparatus and said variable tuning voltage applied to said voltage controlled variable reactance means is derived only from said variable tuning voltage generating means in said tuner means, and
    wherein said tuner means includes a shield member housing at least said tuning circuit, and
    which further comprises a tuning voltage supply path means for supplying said variable tuning voltage from said variable tuning voltage generating means to said voltage controlled variable reactance means located within said shield member, and
    wherein said tuning voltage supply path means has a connection terminal, and said upper limit constant voltage limiting means receives the tuning voltage from the connection terminal,
    whereby said tuning circuit is prevented from deviating from the tuning frequency thereof towards a frequency outside said predetermined upper frequency range associated with said upper limit frequency of said desired receiving frequency band.

2. A tuner apparatus in accordance with claim 1, wherein said upper limit constant voltage limiting means comprises a constant voltage device operatively acting on said tuning voltage applied to said voltage controlled reactance means.

3. A tuner apparatus in accordance with claim 1, wherein
said upper limit constant voltage limiting means is connected to said tuning voltage supply path means, whereby said upper limit constant voltage limiting means limits said variable tuning voltage applied to said voltage controlled variable reactance means to said upper limit voltage.

4. A tuner apparatus in accordance with claim 3, wherein
said shield member is grounded, and
said upper limit constant voltage limiting means comprises a Zener diode having an anode connected to said shield member and a cathode connected to said tuning voltage supply path means.

5. A tuner apparatus in accordance with claim 4, wherein
said tuning voltage supply path means includes a first connection terminal, and
said tuner means includes a second connection terminal being connected to said cathode of said Zener diode,
said first and second connection terminals being connected.

6. A tuner apparatus in accordance with claim 4, wherein
said tuning voltage supply path means includes a first connection terminal,
said tuner means includes a second connection terminal connected to said cathode of said Zener diode, and
said variable tuning voltage generating means includes a voltage source for generating said variable tuning voltage,
said second connection terminal being connected to said voltage source of said variable tuning voltage, whereby the voltage from said voltage source included in said variable tuning voltage generating means is limited to said predetermined voltage by said Zener diode.

7. A tuner apparatus in accordance with claim 4, wherein
said constant voltage device is provided within said shield member.

8. A tuner apparatus in accordance with any one of claim 1, 2, 3, 4, or 5-7, wherein
said tuning circuit includes an upper limit frequency adjusting means for adjusting the upper limit of said tuning frequency.
said upper limit frequency adjusting means being adjusted such that application of said predetermined upper limit voltage, limited by said upper limit constant voltage limiting means, to said voltage controlled variable reactance device, causes said tuning circuit to limit a tuning frequency within said predetermined upper limit frequency range.

9. A tuner apparatus in accordance with claim 8, wherein
said voltage controlled variable reactance means comprises a voltage controlled variable capacitance diode, and
said upper limit frequency adjusting means includes an inductance element.

10. A tuner apparatus in accordance with claim 8, wherein
said tuning circuit comprises characteristic adjusting means for adjusting said tuning frequency variation characteristic of said tuning means to said predetermined frequency variation characteristic after said upper limit frequency of said tuning frequency is adjusted by means of said upper limit frequency adjusting means.

11. A tuner apparatus in accordance with claim 10, wherein
said characteristic adjusting means comprises a trimmer capacitor.

12. A tuner apparatus in accordance with claim 8, wherein
said desired receiving frequency band comprises a first frequency band covering a relatively low frequency range, a second frequency band covering a relatively high frequency range, and a third frequency band covering the highest frequency range higher than that of said second frequency band.

13. A tuner apparatus in accordance with claim 12, wherein
said tuning circuit includes band switching means for selectively switching between said frequency bands, and
said upper limit frequency adjusting means restricts the highest tuning frequency in said third frequency band when said third frequency band is selected by said band switching means.

14. A tuner apparatus in accordance with claim 12, wherein
said tuning circuit includes band switching means for selectively switching between said first and second frequency bands, or said third frequency band, and
said upper limit frequency adjusting means restricts the highest tuning frequency in said third frequency band when said third frequency band is selected by said band switching means.

15. A tuner apparatus in accordance with claim 12, wherein
said upper limit frequency adjusting means restricts the highest tuning frequency in said second frequency band.

16. A tuner apparatus in accordance with claim 15, wherein
said tuning circuit includes band switching means for selectively switching between said respective frequency bands, and
said upper limit frequency adjusting means to restrict the highest tuning frequency in said second frequency band when said second frequency band is selected by said band switching means.

17. A tuner apparatus in accordance with claim 15, wherein
said tuning circuit comprises band switching means for selectively switching between said first and second frequency bands or said third frequency band, and
said upper limit frequency adjusting means restricts the highest tuning frequency in said second frequency band when said second frequency band is selected by said band switching means.

18. A tuner apparatus in accordance with any one of claims 1, 2, 3-4 or 5-7, wherein
said variable tuning voltage generating means includes a potentiometer.

19. A tuner apparatus in accordance with claim 18, wherein said variable tuning voltage generating means comprises tuning voltage preset means for generating a plurality of different tuning voltages corresponding to said plurality of receiving channels.

20. A tuner apparatus in accordance with claim 19, wherein
said tuning voltage preset means comprises a plurality of potentiometers corresponding to said plurality of receiving channels.

21. A tuner apparatus in accordance with any one of the preceding claims 1, 2, 3–4, or 5–7, wherein said variable tuning voltage generating means comprises
channel selecting pulse train generating means for generating a pulse train, the number of pulses corresponding to a channel being selected, and
converting means for converting the number of pulses included in the said pulse train to the corresponding tuning voltage.

22. A tuner apparatus in accordance with any one of the preceding claims 1, 2, 3–4 or 5–7, wherein
said variable tuning voltage generating means includes a phase locked loop.

23. A tuner apparatus comprising:
a voltage controlled variable reactance means the reactance of which varies as a function of a control voltage being applied thereto,
a tuner means comprising a tuning circuit including said voltage controlled variable reactance means, said tuning circuit having a tuning frequency variation characteristic dependent upon the variation of the reactance of said voltage controlled variable reactance means,
variable tuning voltage generating means coupled to said voltage controlled variable reactance means for generating a variable tuning voltage and applying said tuning voltage to said voltage controlled variable reactance means as said control voltage therefor, wherein the variation range of said variable tuning voltage is selected such that the variation of the tuning frequency over a desired receiving frequency band is defined by a predetermined upper limit frequency and a predetermined lower limit frequency and wherein a plurality of receiving channels are distributed between said upper limit frequency and said lower limit frequency,
upper limit constant voltage limiting means for limiting to a predetermined upper limit voltage said variable tuning voltage applied to said voltage controlled variable reactance means by said variable tuning voltage generating means when said variable tuning voltage exceeds said predetermined upper limit voltage, said predetermined upper limit voltage being selected such that said tuning circuit is tuned to a tuning frequency falling within a predetermined upper frequency range associated with said upper limit frequency of said desired receiving frequency band, and
lower limit constant voltage limiting means for limiting to a predetermined lower limit voltage said variable tuning voltage applied to said voltage controlled variable reactance means by said variable tuning voltage generating means when said variable tuning voltage exceeds said predetermined lower limit voltage, said predetermined lower limit voltage being selected that said tuning circuit is tuned to a tuning frequency within a predetermined lower frequency range associated with said lower limit frequency of said desired receiving frequency band,
whereby said tuning circuit is prevented from deviating from the tuning frequency thereof towards a frequency outside said predetermined lower frequency range associated with said lower limit frequency of said desired receiving frequency band.

24. A tuner apparatus in accordance with claim 23, wherein said lower limit constant voltage limiting means comprises
predetermined voltage generating means for generating a predetermined voltage, and
predetermined voltage applying means for applying said predetermined voltage to said voltage controlled variable reactance means when said variable tuning voltage from said variable tuning voltage generating means is lower than said predetermined voltage from said predetermined voltage generating means.

25. A tuner apparatus in accordance with claim 24, which further comprises
a tuning voltage supply path means for supplying said variable tuning voltage from said variable tuning voltage generating means to said voltage controlled variable reactance means, and wherein
said predetermined voltage applying means comprises a voltage responsive switching means coupled between said predetermined voltage generating means and said tuning voltage supply path means, whereby said voltage responsive switching means is rendered non conductive when said variable tuning voltage is higher than said predetermined voltage and is rendered conductive when said variable tuning voltage is lower than said predetermined voltage.

26. A tuner apparatus in accordance with claim 25, wherein
said tuning voltage supply path means comprises interference blocking means for blocking interference from said lower limit constant voltage limiting means on said variable tuning voltage generating means when said predetermined voltage applying means is enabled.

27. A tuner apparatus in accordance with claim 26, wherein
said interference blocking means comprises high impedance means.

28. A tuner apparatus in accordance with claim 27, wherein
said interference blocking means comprise a diode, said diode having an anode connected to the output of said variable tuning voltage generating means and a cathode connected to said voltage controlled variable reactance means.

29. A tuner apparatus in accordance with claim 27, wherein
said interference blocking means comprises a resistor having a relatively large resistance value.

30. A tuner apparatus in accordance with claim 24, wherein said predetermined voltage generating means comprises
a voltage source, and
a voltage divider for dividing the voltage from said voltage source to said predetermined voltage.

31. A tuner apparatus in accordance with claim 30, wherein
said voltage divider includes a variable resistor.

32. A tuner apparatus in accordance with claim 24, wherein
said desired receiving frequency band comprises a first frequency band covering a relatively low frequency range, a second frequency band covering a relatively high frequency range, and a third frequency range covering the highest frequency range which is higher than that of said second frequency band, and said tuner apparatus includes
band selecting voltage generating means for generating a band selecting voltage for selecting any one of said first, second and third frequency bands, and
tuning adapting means responsive to said band selecting voltage from said band selecting voltage generating means for adapting said tuning circuit to the corresponding one of said frequency bands.

33. A tuner apparatus in accordance with claim 32, wherein
said predetermined voltage generating means uses said band selecting voltage from said band selecting voltage generating means as said predetermined voltage.

34. A tuner apparatus in accordance with claim 33, wherein
said predetermined voltage generating means includes a voltage divider for dividing said band selecting voltage from said band selecting voltage generating means to said predetermined voltage.

35. A tuner apparatus in accordance with claim 32, wherein
said lower limit constant voltage limiting means is provided for each of the frequency bands, and
said predetermined voltage generating means for each of said frequency bands uses the corresponding band selecting voltage from said band selecting voltage generating means.

36. A tuner apparatus in accordance with claim 35, wherein
said predetermined voltage generating means for each of said frequency bands comprise a voltage divider for dividing said corresponding band selecting voltage to said predetermined voltage.

37. A tuner apparatus in accordance with claim 23, wherein
said variable tuning voltage generating means includes a potentiometer, and
said lower limit constant voltage limiting means is connected in series with said potentiometer, whereby said lower limit in said variable tuning voltage is restricted.

38. A tuner apparatus in accordance with claim 37, including first means for providing a first frequency band covering a relatively low frequency range, a second means for providing a second frequency band covering a relatively high frequency range, and a third means for providing a third frequency band covering the highest frequency range which is higher than that of said second frequency band, wherein
said potentiometer is commonly connected to said first means, said second means and said third means, and
said lower limit constant voltage limiting means is separately provided in each of said first, second and third means and is connected in series with said common potentiometer.

39. A tuner apparatus in accordance with claim 23, wherein
said variable tuning voltage generating means comprises a voltage source and a variable resistor, and
said lower limit constant voltage limiting means includes a resistor connected between said variable resistor and the ground.

40. A tuner apparatus, comprising:
a voltage controlled variable reactance means the reactance of which is variable as a function of a control voltage being applied thereto,
a tuner means comprising a tuning circuit including said voltage controlled variable reactance means, said tuning circuit having a tuning frequency variation characteristic dependent upon the variation of the reactance of said voltage controlled variable reactance means,
variable tuning voltage generating means coupled to said voltage controlled variable reactance means, for generating a variable tuning voltage and applying said tuning voltage to said voltage controlled variable reactance means as said control voltage therefor, wherein the variation range of said variable tuning voltage is selected such that the variation of the tuning frequency over a desired receiving frequency band is defined by a predetermined upper limit frequency and a predetermined lower limit frequency and wherein a plurality of receiving channels are distributed between said upper limit frequency and said lower limit frequency, said desired receiving frequency band comprising a first frequency band covering a relatively low frequency range, a second frequency band covering a relatively high frequency range, and a third frequency range covering the highest frequency range which is higher than that of said second frequency band,
band selecting voltage generating means for generating a band selecting voltage for selecting any one of said first, second and third frequency bands,
tuning adapting means responsive to said band selecting voltage from said band selecting voltage generating means for adapting said tuning circuit to the corresponding one of said frequency bands, and
lower limit constant voltage limiting means for limiting to a predetermined lower limit voltage said variable tuning voltage applied to said voltage controlled variable reactance means by said variable tuning voltage generating means when said variable tuning voltage exceeds said predetermined lower limit voltage, said predetermined lower limit voltage being selected such that said tuning circuit is tuned to a tuning frequency falling within a predetermined lower frequency range associated with said lower limit frequency of said desired receiving frequency band, wherein said lower limit constant voltage limiting means comprises predetermined voltage generating means for generating a predetermined voltage for each of said frequency bands,
said predetermined voltage generating means for each of said frequency bands using the corresponding band selecting voltage from said band selecting voltage generating means, and predetermined voltage applying means for applying said predetermined voltage to said voltage controlled variable reactance means when said variable tuning voltage from said variable tuning voltage generating means is lower than said predetermined voltage from said predetermined voltage generating means, whereby said tuning circuit is prevented from deviating from the tuning frequency thereof towards a frequency outside said predetermined lower frequency range associated with said lower limit frequency of said desired receiving frequency band.

41. A tuner apparatus in accordance with claim 40, wherein
said predetermined voltage generating means for each of said frequency bands comprises a voltage divider for dividing said corresponding band selecting voltage to said predetermined voltage.

* * * * *